(12) United States Patent
Shim et al.

(10) Patent No.: US 10,115,672 B2
(45) Date of Patent: Oct. 30, 2018

(54) DOUBLE-SIDED SEMICONDUCTOR PACKAGE AND DUAL-MOLD METHOD OF MAKING SAME

(71) Applicant: STATS ChipPAC Pte. Ltd., Singapore (SG)

(72) Inventors: Il Kwon Shim, Singapore (SG); Pandi C. Marimuthu, Singapore (SG); Yaojian Lin, Jiangyin (CN)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/816,743

(22) Filed: Nov. 17, 2017

(65) Prior Publication Data

US 2018/0076142 A1 Mar. 15, 2018

Related U.S. Application Data

(62) Division of application No. 15/089,151, filed on Apr. 1, 2016, now Pat. No. 9,893,017.

(Continued)

(51) Int. Cl.
*H01L 23/538* (2006.01)
*H01L 21/56* (2006.01)
(Continued)

(52) U.S. Cl.
CPC ........ *H01L 23/5389* (2013.01); *H01L 21/486* (2013.01); *H01L 21/561* (2013.01);
(Continued)

(58) Field of Classification Search
CPC ............ H01L 23/5389; H01L 23/3128; H01L 25/105
See application file for complete search history.

(56) References Cited

U.S. PATENT DOCUMENTS

| 4,955,523 A | 9/1990 | Calomagno et al. |
| 5,371,654 A | 12/1994 | Beaman et al. |

(Continued)

FOREIGN PATENT DOCUMENTS

CN 102637608 A 8/2012

*Primary Examiner* — Peniel M Gumedzoe
(74) *Attorney, Agent, or Firm* — Brian M. Kaufman; Robert D. Atkins; Patent Law Group: Atkins and Associates, P.C.

(57) ABSTRACT

A semiconductor device comprises a first conductive layer formed on a carrier over an insulating layer. A portion of the insulating layer is removed prior to forming the first conductive layer. A first semiconductor die is disposed over the first conductive layer. A discrete electrical component is disposed over the first conductive layer adjacent to the first semiconductor die. A first encapsulant is deposited over the first conductive layer and first semiconductor layer. A conductive pillar is formed through the first encapsulant between the first conductive layer and second conductive layer. A second encapsulant is deposited around the first encapsulant, first conductive layer, and first semiconductor die. A second conductive layer is formed over the first semiconductor die, first encapsulant, and second encapsulant opposite the first conductive layer. The carrier is removed after forming the second conductive layer. A semiconductor package is mounted to the first conductive layer.

23 Claims, 14 Drawing Sheets

Related U.S. Application Data

(60) Provisional application No. 62/145,080, filed on Apr. 9, 2015.

(51) Int. Cl.
*H01L 21/683* (2006.01)
*H01L 23/31* (2006.01)
*H01L 25/10* (2006.01)
*H01L 23/00* (2006.01)
*H01L 21/48* (2006.01)
*H01L 25/16* (2006.01)

(52) U.S. Cl.
CPC ........ *H01L 21/568* (2013.01); *H01L 21/6835* (2013.01); *H01L 23/3128* (2013.01); *H01L 24/19* (2013.01); *H01L 24/20* (2013.01); *H01L 24/97* (2013.01); *H01L 25/105* (2013.01); *H01L 23/5384* (2013.01); *H01L 24/16* (2013.01); *H01L 24/29* (2013.01); *H01L 24/32* (2013.01); *H01L 24/45* (2013.01); *H01L 24/48* (2013.01); *H01L 24/73* (2013.01); *H01L 24/83* (2013.01); *H01L 24/85* (2013.01); *H01L 24/92* (2013.01); *H01L 25/16* (2013.01); *H01L 2221/6834* (2013.01); *H01L 2221/68327* (2013.01); *H01L 2221/68345* (2013.01); *H01L 2221/68359* (2013.01); *H01L 2221/68381* (2013.01); *H01L 2224/0401* (2013.01); *H01L 2224/04042* (2013.01); *H01L 2224/04105* (2013.01); *H01L 2224/12105* (2013.01); *H01L 2224/16227* (2013.01); *H01L 2224/24195* (2013.01); *H01L 2224/2919* (2013.01); *H01L 2224/2929* (2013.01); *H01L 2224/2939* (2013.01); *H01L 2224/32225* (2013.01); *H01L 2224/45147* (2013.01); *H01L 2224/48091* (2013.01); *H01L 2224/48227* (2013.01); *H01L 2224/73227* (2013.01); *H01L 2224/73265* (2013.01); *H01L 2224/73267* (2013.01); *H01L 2224/83* (2013.01); *H01L 2224/83005* (2013.01); *H01L 2224/83192* (2013.01); *H01L 2224/85* (2013.01); *H01L 2224/85005* (2013.01); *H01L 2224/92164* (2013.01); *H01L 2224/92244* (2013.01); *H01L 2224/92247* (2013.01); *H01L 2224/94* (2013.01); *H01L 2224/97* (2013.01); *H01L 2225/1035* (2013.01); *H01L 2225/1041* (2013.01); *H01L 2225/1058* (2013.01); *H01L 2924/00012* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); *H01L 2924/3511* (2013.01)

(56) References Cited

U.S. PATENT DOCUMENTS

| | | |
|---|---|---|
| 5,455,390 A | 10/1995 | DiStefano et al. |
| 5,495,667 A | 3/1996 | Farnworth et al. |
| 5,601,740 A | 2/1997 | Eldrige et al. |
| 5,635,767 A | 6/1997 | Wenzel et al. |
| 6,133,072 A | 10/2000 | Fjelstad |
| 6,207,549 B1 | 3/2001 | Higashi et al. |
| 6,476,503 B1 | 11/2002 | Imamura et al. |
| 6,477,768 B1 | 11/2002 | Wildner |
| 6,690,090 B2 | 2/2004 | Kimura |
| 6,972,496 B2 | 12/2005 | Choi |
| 7,227,095 B2 | 6/2007 | Roberts et al. |
| 7,271,497 B2 | 9/2007 | Joshi et al. |
| 7,497,694 B2 | 3/2009 | Kariya et al. |
| 7,608,921 B2 | 10/2009 | Pendse |
| 7,855,462 B2 | 12/2010 | Boon et al. |
| 7,993,972 B2 | 8/2011 | Lin et al. |
| 7,994,431 B2 | 8/2011 | Yamano et al. |
| 8,035,210 B2 | 10/2011 | Yang et al. |
| 8,035,211 B2 | 10/2011 | Ko et al. |
| 8,138,017 B2 | 3/2012 | Chin |
| 8,174,119 B2 | 5/2012 | Pendse |
| 8,193,034 B2 | 6/2012 | Pagaila et al. |
| 8,466,544 B2 | 6/2013 | Pagaila |
| 2007/0108583 A1 | 5/2007 | Shim et al. |
| 2007/0187826 A1 | 8/2007 | Shim et al. |
| 2009/0008762 A1 | 1/2009 | Jung |
| 2009/0072375 A1 | 3/2009 | Song et al. |
| 2009/0166835 A1 | 7/2009 | Yang et al. |
| 2009/0261460 A1 | 10/2009 | Kuan et al. |
| 2009/0261466 A1 | 10/2009 | Pagaila et al. |
| 2009/0273094 A1 | 11/2009 | Ha et al. |
| 2009/0309212 A1 | 12/2009 | Shim et al. |
| 2010/0214759 A1 | 8/2010 | Beddingfield et al. |
| 2010/0244222 A1 | 9/2010 | Chi et al. |
| 2010/0270656 A1 | 10/2010 | Do et al. |
| 2010/0327439 A1 | 12/2010 | Hwang et al. |
| 2011/0068444 A1 | 3/2011 | Chi et al. |
| 2011/0140263 A1 | 6/2011 | Camacho et al. |
| 2011/0241193 A1 | 10/2011 | Ding et al. |
| 2011/0278736 A1 | 11/2011 | Lin et al. |
| 2011/0285005 A1 | 11/2011 | Lin et al. |
| 2012/0018897 A1* | 1/2012 | Park ................ H01L 21/561 257/774 |
| 2012/0018900 A1 | 1/2012 | Pagaila et al. |
| 2012/0038064 A1 | 2/2012 | Camacho et al. |
| 2012/0049366 A1 | 3/2012 | Zeng |
| 2012/0056329 A1 | 3/2012 | Pagaila et al. |
| 2012/0074585 A1 | 3/2012 | Koo et al. |
| 2012/0119388 A1 | 5/2012 | Cho et al. |
| 2012/0199972 A1 | 8/2012 | Pagaila et al. |
| 2012/0217645 A1 | 8/2012 | Pagaila |
| 2012/0273947 A1 | 11/2012 | Mo |
| 2012/0273960 A1 | 11/2012 | Park et al. |
| 2012/0286419 A1 | 11/2012 | Kwon et al. |
| 2013/0147041 A1 | 6/2013 | Chan et al. |
| 2013/0270682 A1 | 10/2013 | Hu et al. |
| 2013/0292850 A1 | 11/2013 | Chua et al. |
| 2015/0179570 A1 | 6/2015 | Marimuthu et al. |
| 2015/0179616 A1 | 6/2015 | Lin et al. |

\* cited by examiner

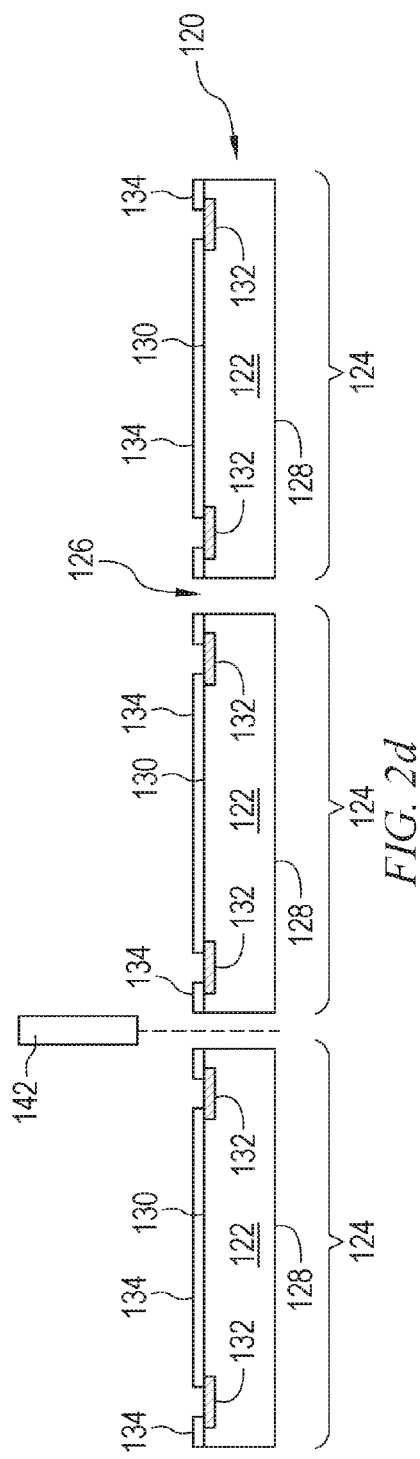
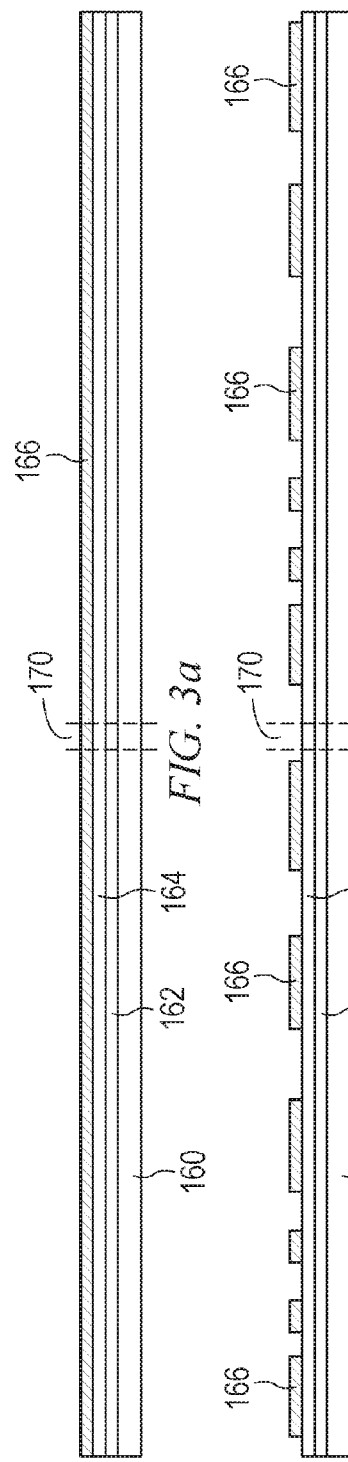
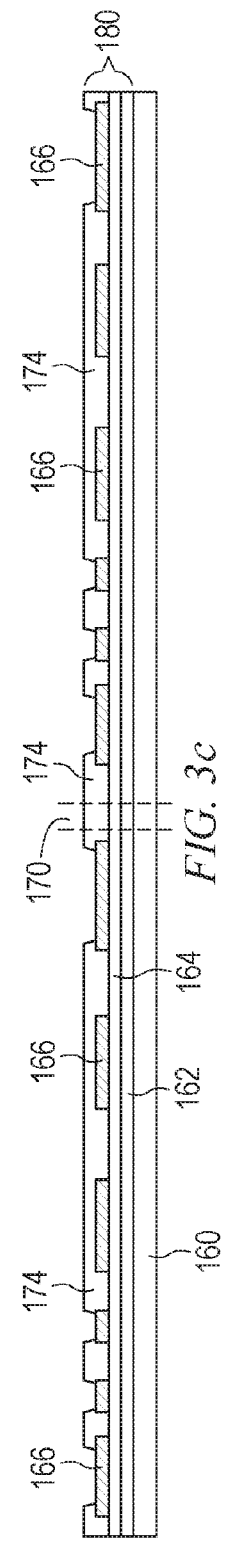

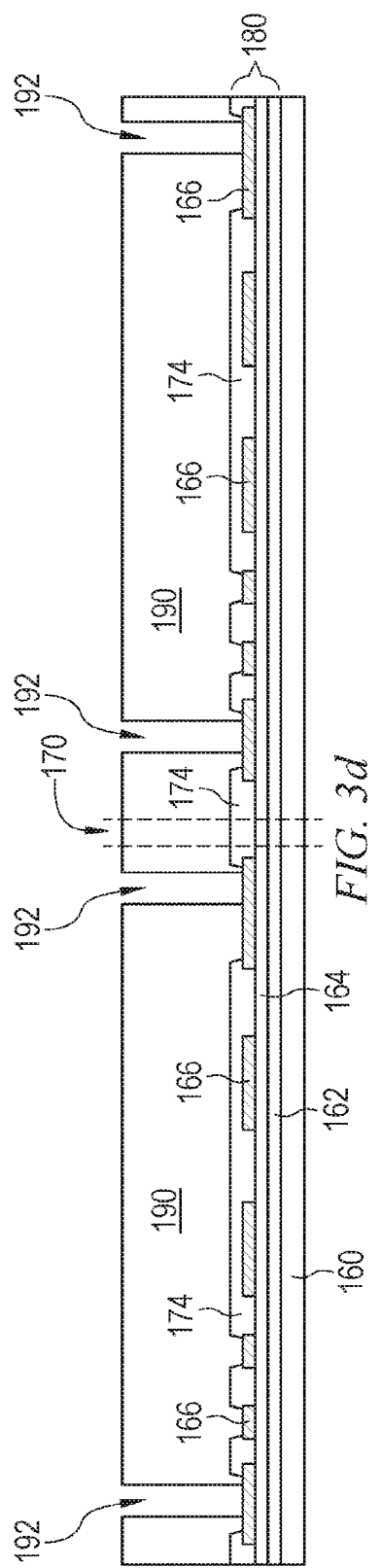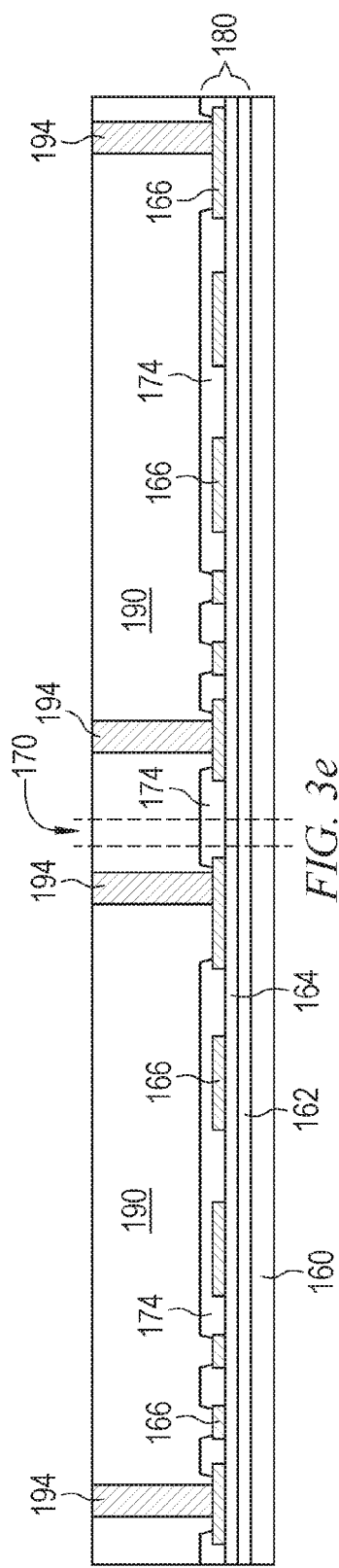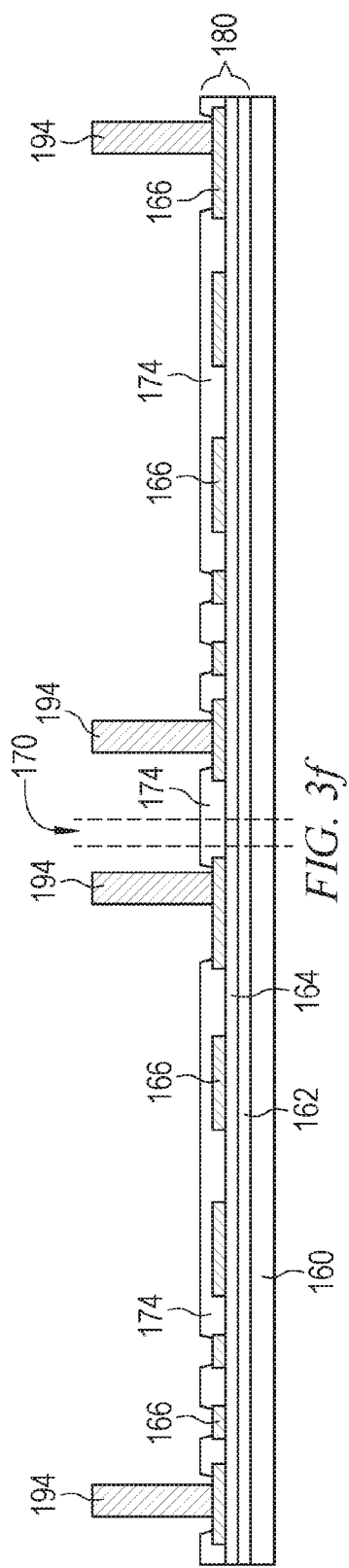

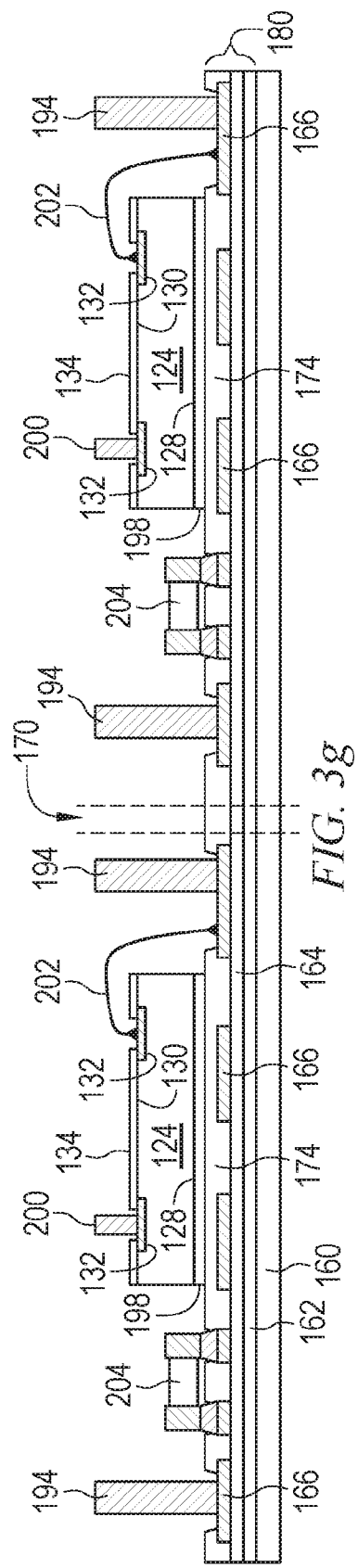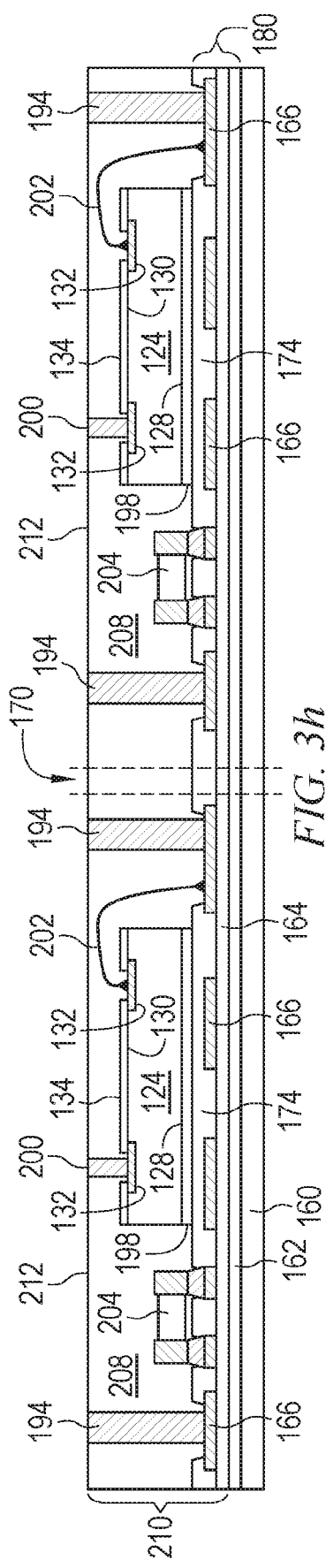

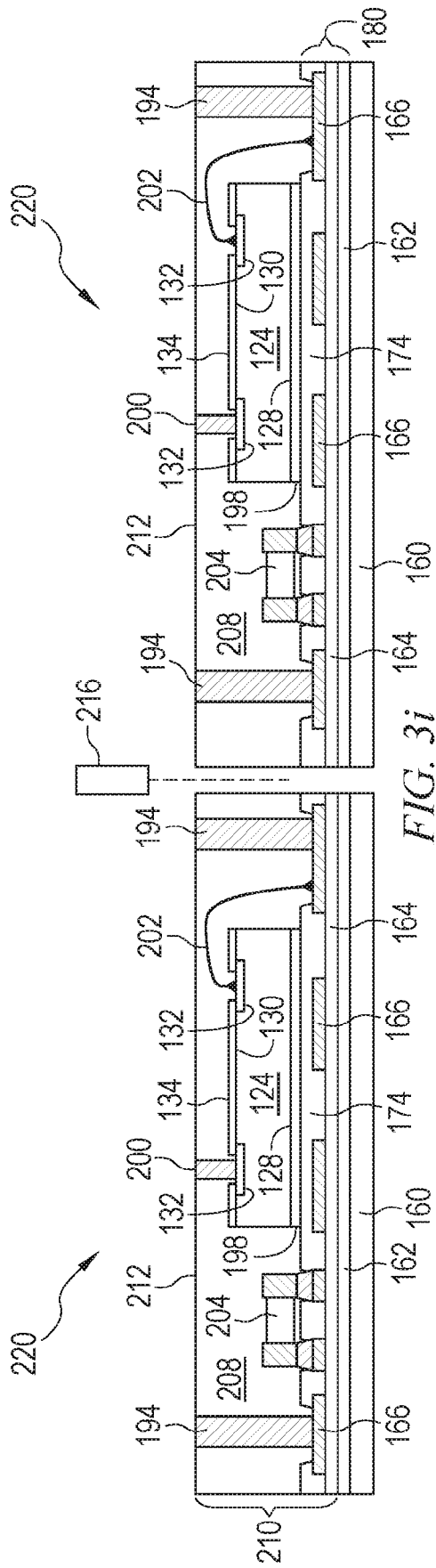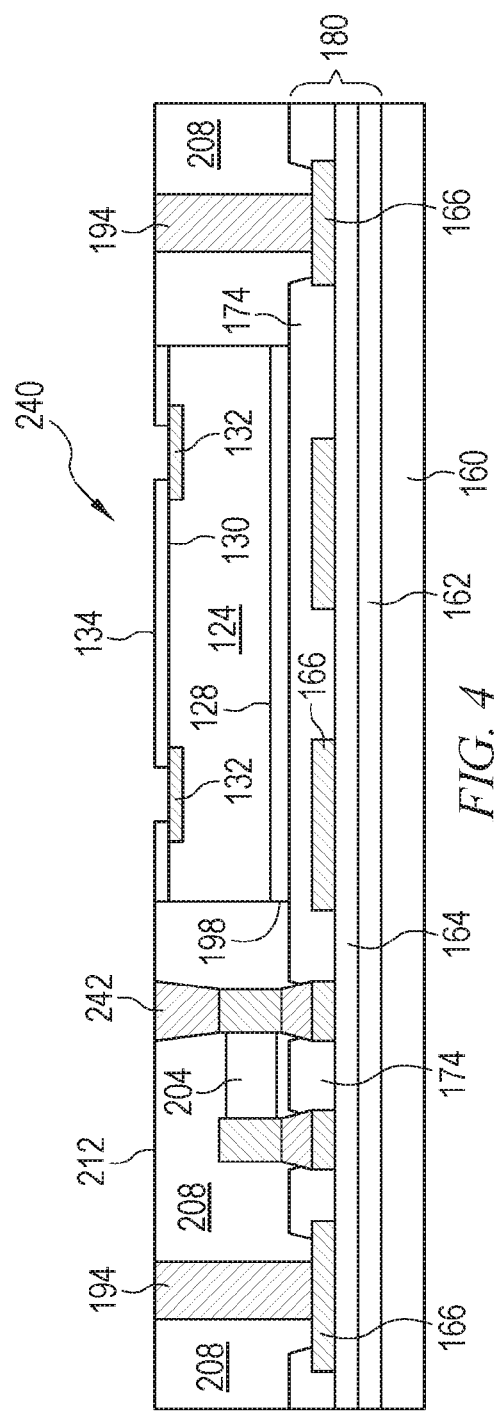

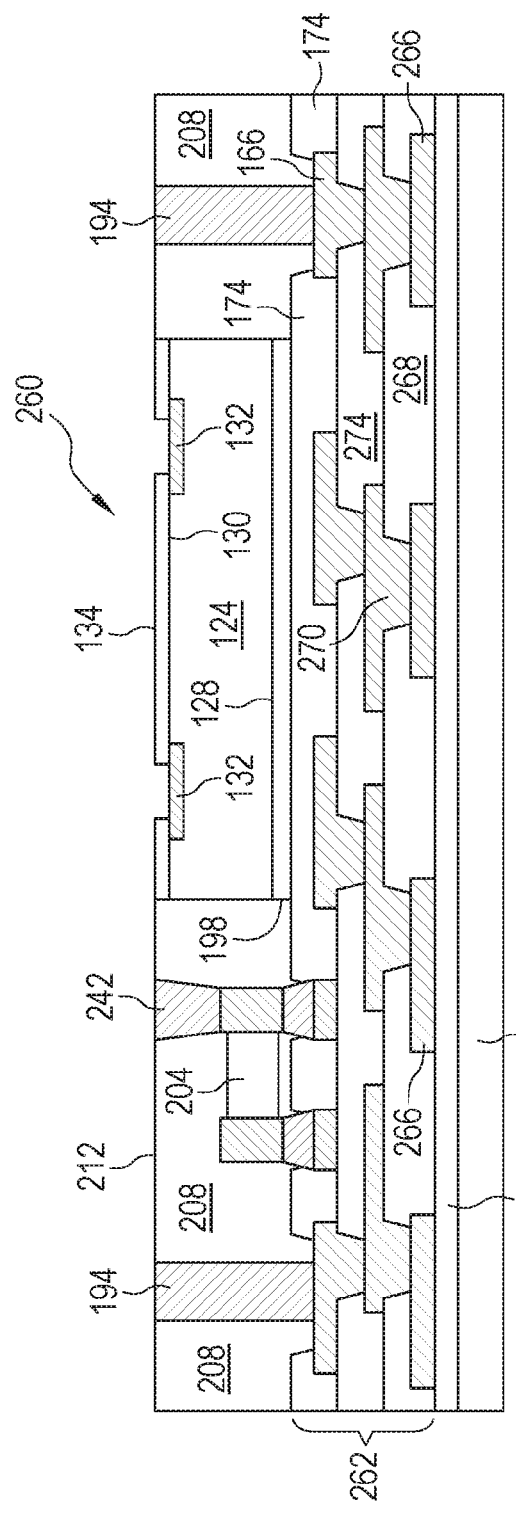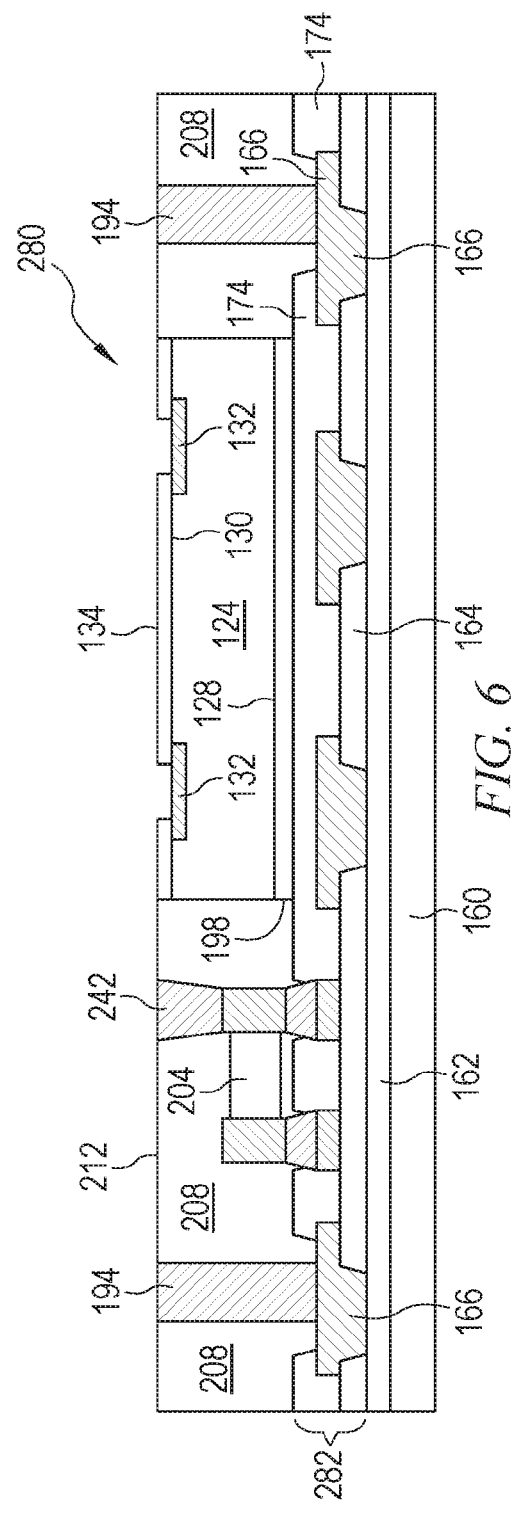

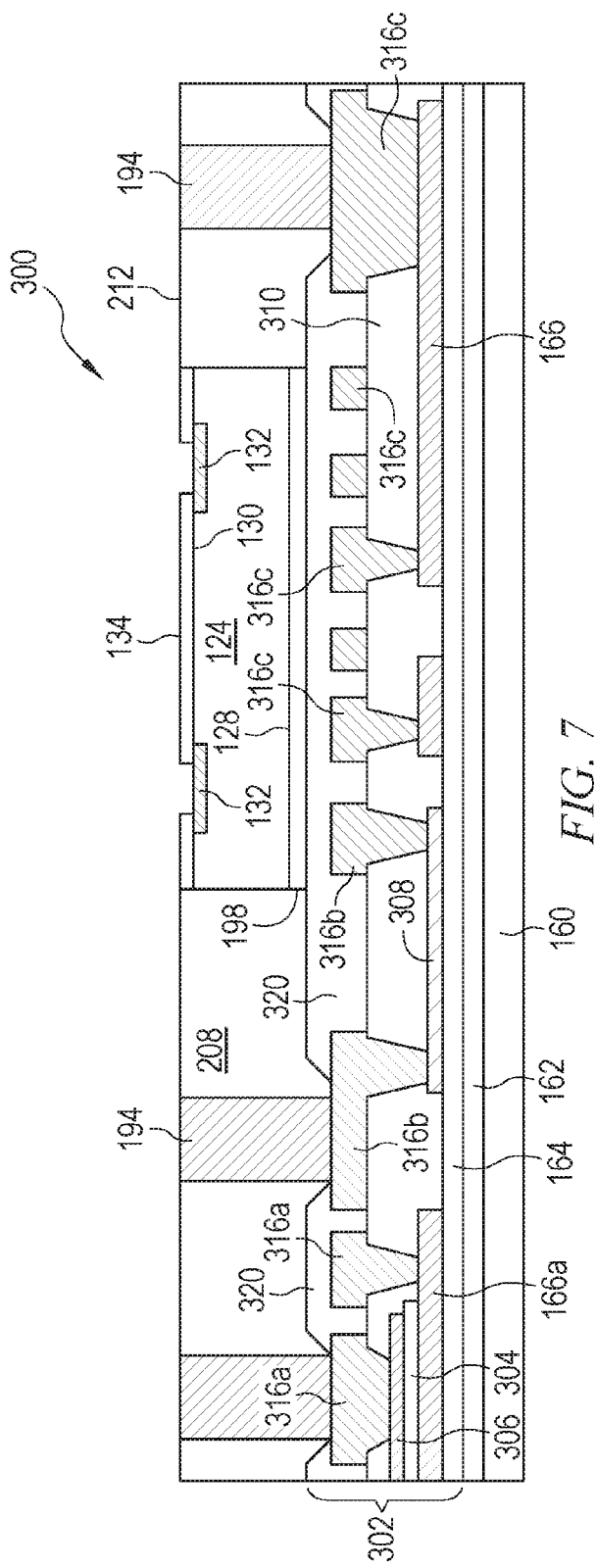
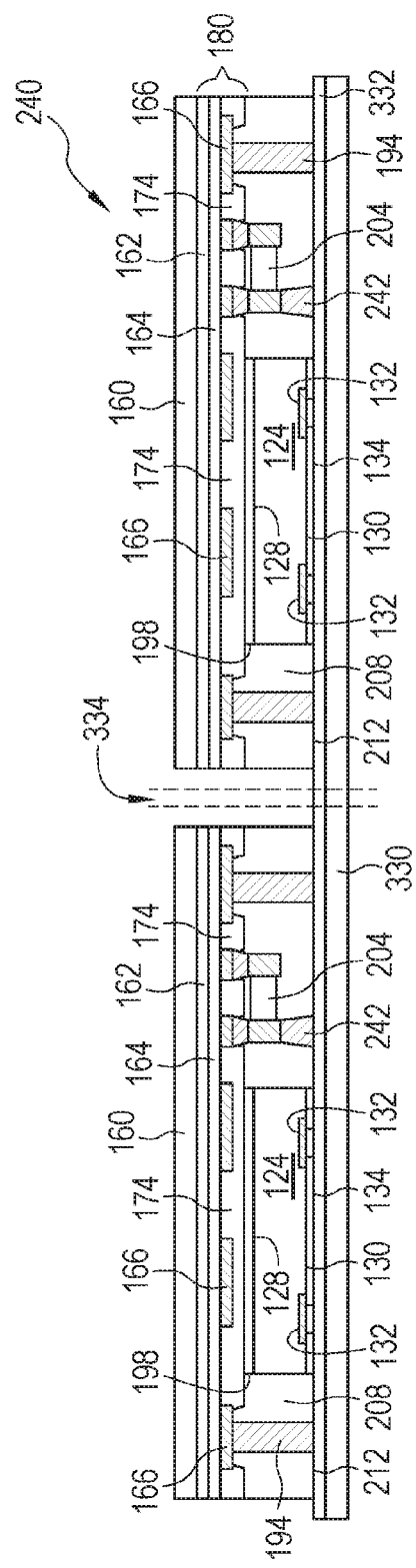
FIG. 7
FIG. 8a

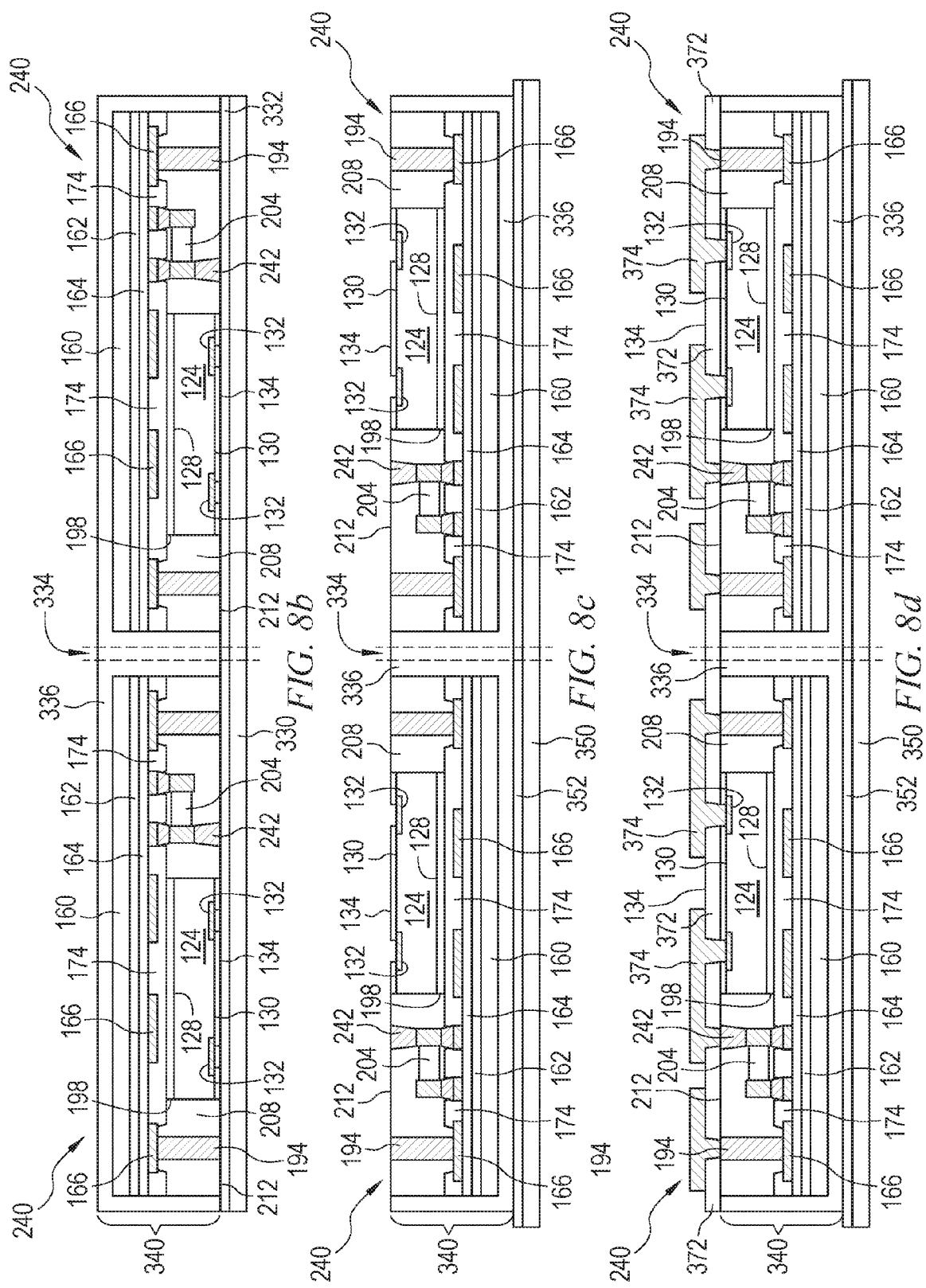

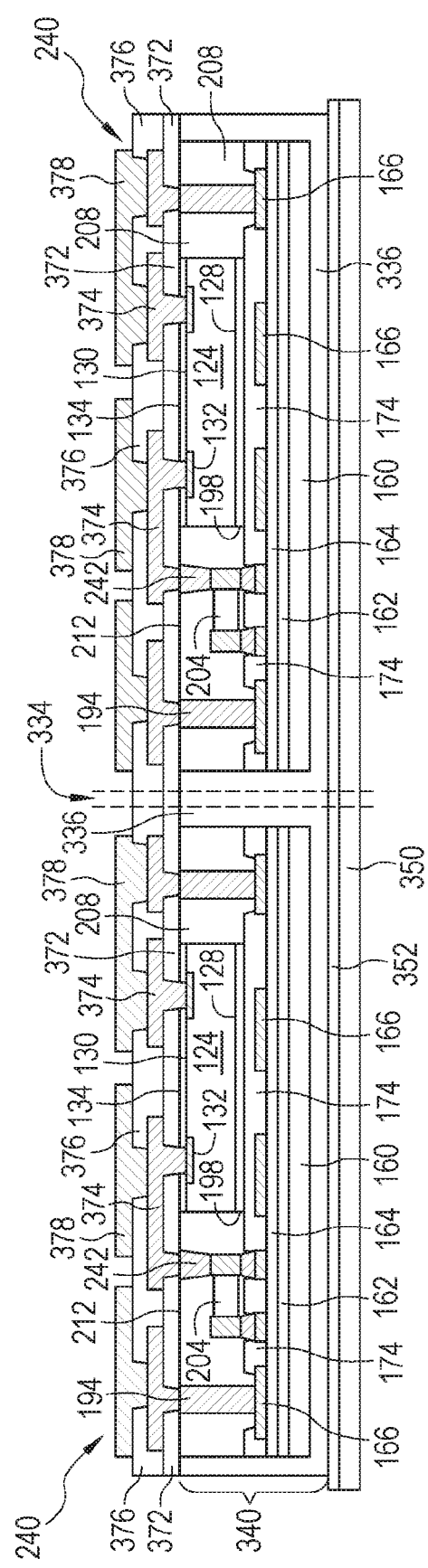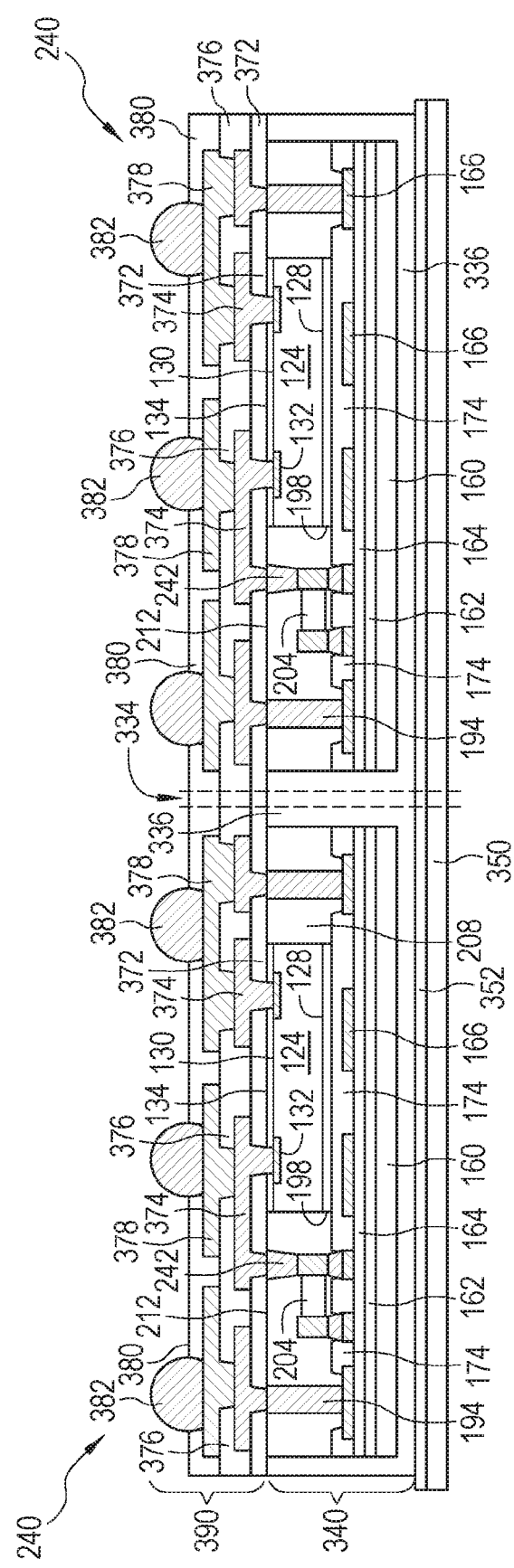

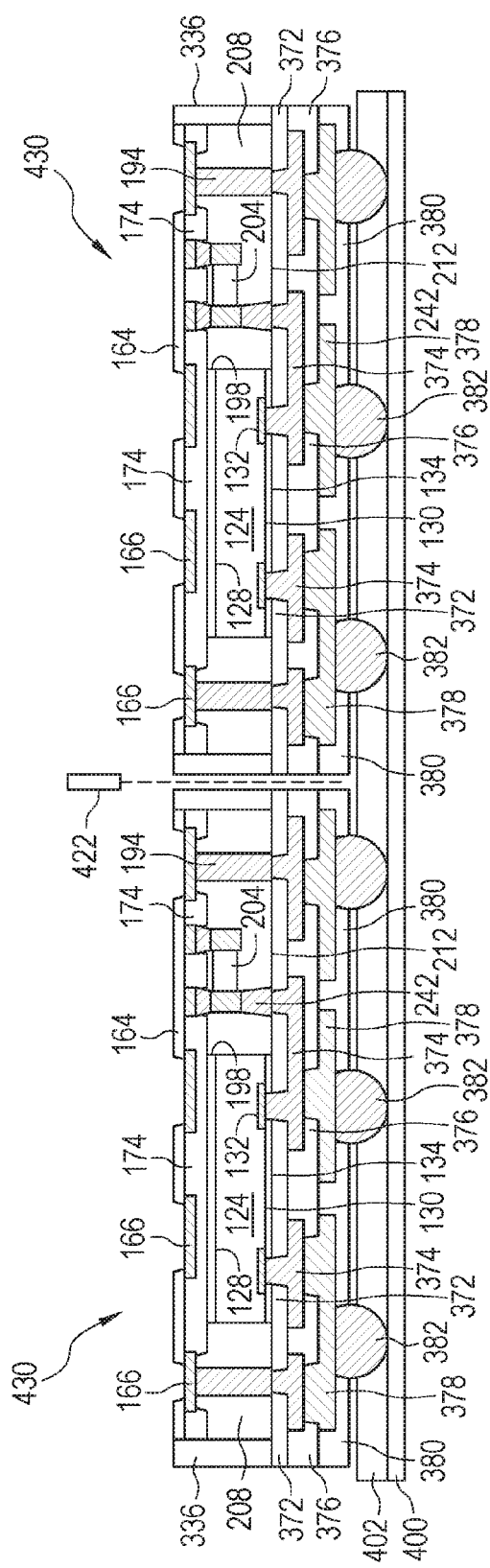
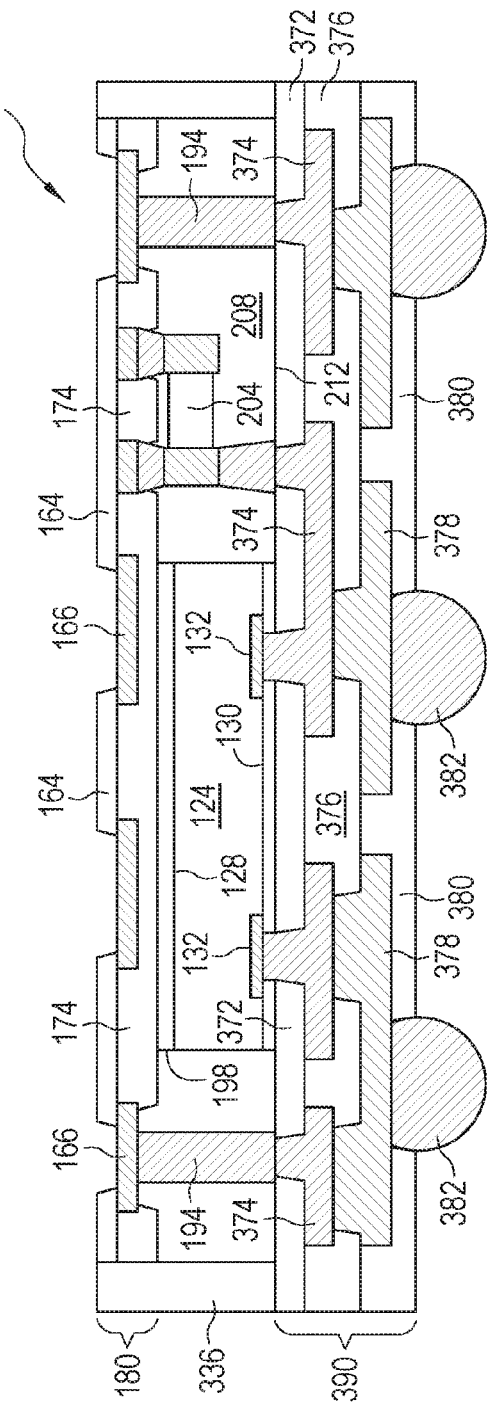

DOUBLE-SIDED SEMICONDUCTOR PACKAGE AND DUAL-MOLD METHOD OF MAKING SAME

CLAIM OF DOMESTIC PRIORITY

The present application is a division of U.S. patent application Ser. No. 15/089,151, now U.S. Pat. No. 9,893,017, filed Apr. 1, 2016, which claims the benefit of U.S. Provisional Application No. 62/145,080, filed Apr. 9, 2015, which applications are incorporated herein by reference.

FIELD OF THE INVENTION

The present invention relates in general to semiconductor devices and, more particularly, to a semiconductor device and method of forming a double-sided semiconductor package using a dual-mold method.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to control and limit warpage during semiconductor package assembly. Package warpage can create stresses between package layers and lead to cracking or interlayer delamination. Inherent stresses within a semiconductor package impact long-term board level reliability. Warpage issues are exacerbated by the trend toward smaller and finer pitched conductive traces. Controlling warpage during package manufacturing increases part yield and reduces failure rate.

BRIEF DESCRIPTION OF THE DRAWINGS

FIGS. 2a-2d illustrate a semiconductor wafer with a plurality of semiconductor die separated by a saw street;

FIGS. 3a-3i illustrate a method of forming a sub-package to use as the base of a double-sided package;

FIG. 4 illustrates a completed sub-package with encapsulant etched away to expose a semiconductor die;

FIG. 5 illustrates a completed sub-package including multiple back-side RDL layers;

FIG. 6 illustrates a completed sub-package including recessed contact pads;

FIG. 7 illustrates a completed sub-package with RDL layers forming integrated passive devices (IPDs);

FIGS. 8a-8i illustrate formation of double-sided packages based on the sub-packages;

FIGS. 9a-9c illustrate completed double-sided packages; and

DETAILED DESCRIPTION OF THE DRAWINGS

Figure 1:
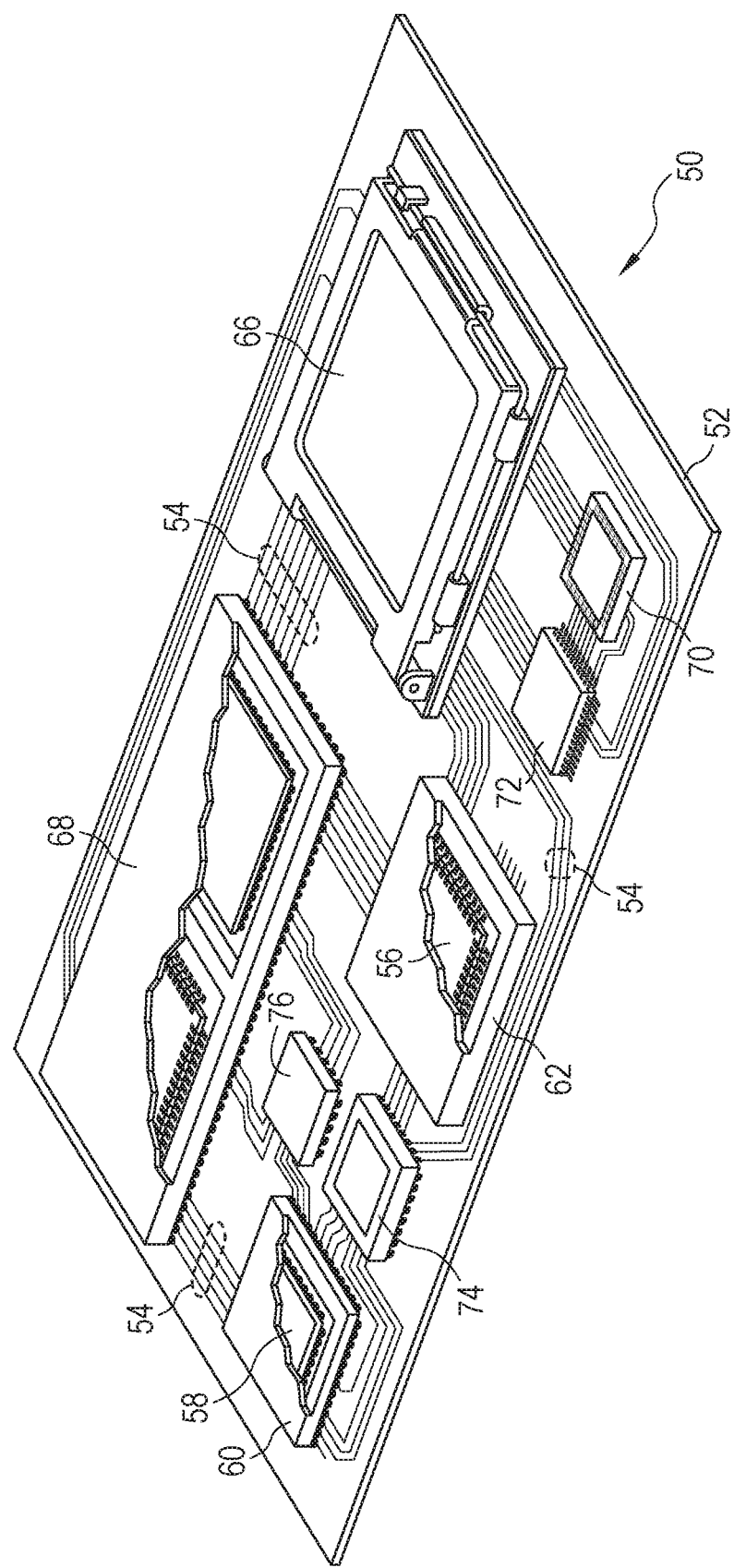
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
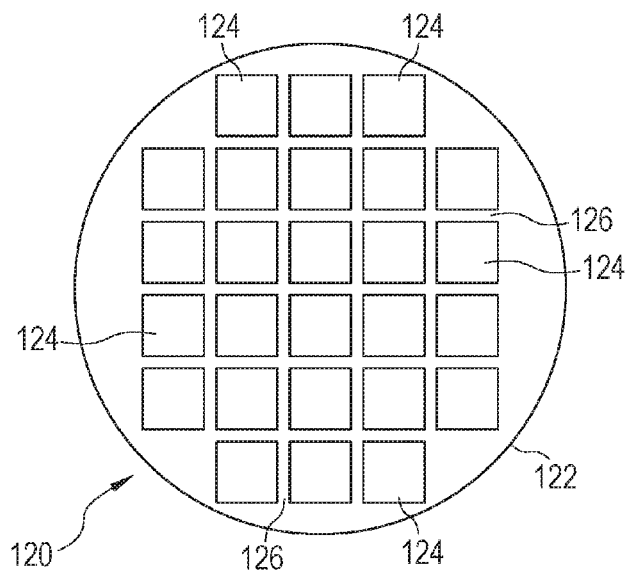

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
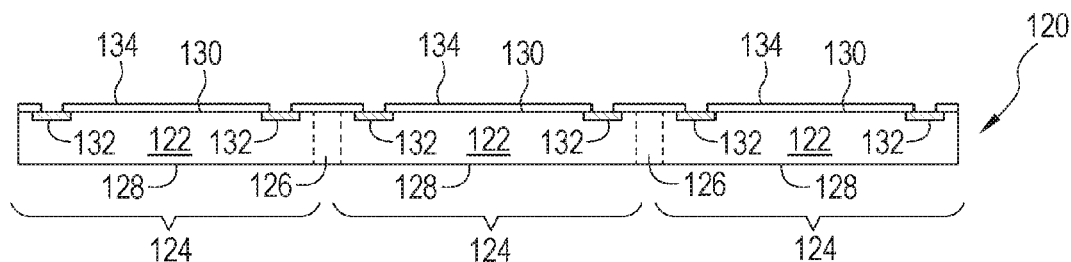

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. Semiconductor die 124 may also contain integrated passive devices (IPDs), such as inductors, capacitors, and resistors, for RF signal processing. Back surface 128 of semiconductor wafer 120 may undergo an optional backgrinding operation with a mechanical grinding or etching process to remove a portion of base material 122 and reduce the thickness of semiconductor wafer 120 and semiconductor die 124.

An electrically conductive layer 132 is formed over active surface 130 using PVD, CVD, electrolytic plating, electroless plating process, or other suitable metal deposition process. Conductive layer 132 includes one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
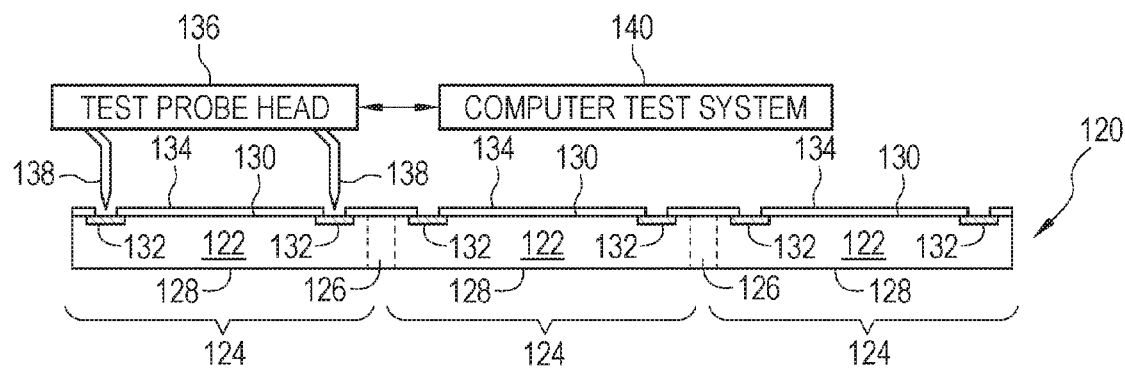

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with nodes or conductive layer 132 on each semiconductor die 124 and provide electrical stimuli to contact pads 132. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 2d, semiconductor wafer 120 is singulated through saw street 126 using a saw blade or laser cutting tool 142 into individual semiconductor die 124. The individual semiconductor die 124 can be inspected and electrically tested for identification of KGD post singulation.

FIGS. 3a-3i illustrate formation of a sub-package with semiconductor die 124 as part of the process of forming a double-sided semiconductor package using a dual-mold process. FIG. 3a shows a cross-sectional view of a portion of a carrier or temporary substrate 160 containing sacrificial base material such as silicon, polymer, beryllium oxide, glass, or other suitable low-cost, rigid material for structural support. An optional interface layer or double-sided tape 162 is formed over carrier 160 as a temporary adhesive bonding film, etch-stop layer, or thermal release layer.

Carrier 160 can be a round or rectangular panel with capacity for multiple semiconductor die 124. Carrier 160 may have a larger surface area than the surface area of semiconductor wafer 120. A larger carrier reduces the manufacturing cost of the semiconductor package as more semiconductor die can be processed on the larger carrier, thereby reducing the cost per unit. Semiconductor packaging and processing equipment are designed and configured for the size of the wafer or carrier being processed.

To further reduce manufacturing costs, the size of carrier 160 is selected independent of the size of semiconductor die 124 or the size of semiconductor wafer 120. That is, carrier 160 has a fixed or standardized size, which can accommodate various size semiconductor die 124 singulated from one or more semiconductor wafers 120. In one embodiment, carrier 160 is circular with a diameter of 330 mm. In another embodiment, carrier 160 is rectangular with a width of 560 mm and length of 600 mm. Semiconductor die 124 may have dimensions of 10 mm by 10 mm, which are packaged using the standardized carrier 160. Alternatively, semiconductor die 124 may have dimensions of 20 mm by 20 mm, which are packaged using the same standardized carrier 160. Accordingly, standardized carrier 160 can handle any size semiconductor die 124, which allows subsequent semiconductor processing equipment to be standardized to a common carrier, i.e., independent of die size or incoming wafer size.

Semiconductor packaging equipment can be designed and configured for a standard carrier using a common set of processing tools, equipment, and bill of materials to process any semiconductor die size from any incoming wafer size. The common or standardized carrier 160 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

An insulating or passivation layer 164 is formed over carrier 160 and bonding layer 162. Insulating layer 164 is formed using PVD, CVD, printing, lamination, spin coating, spray coating, sintering, or thermal oxidation. Insulating layer 164 contains one or more layers of silicon dioxide (SiO2), silicon nitride (Si3N4), silicon oxynitride (SiON), tantalum pentoxide (Ta2O5), aluminum oxide (Al2O3), Hafnium Oxide (HfO2), benzocyclobutene (BCB), polyimide (PI), polybenzoxazoles (PBO), polymer dielectric resist with or without fillers or fibers, solder resist, or other material having similar insulating and structural properties.

In one embodiment, insulating layer 164 includes glass cloth, filler, or fiber, e.g., E-glass cloth, T-glass cloth, Al2O3, or silica filler, for enhanced bending strength. In some embodiments, insulating layer 164 is a relatively dark color and substantially opaque.

An electrically conductive layer 166 is formed over insulating layer 164 using a metal deposition process such as printing, PVD, CVD, sputtering, electrolytic plating, or electroless plating. In other embodiments, conductive layer 166 is a sheet of conductive material laminated over carrier 160, bonding layer 162, and insulating layer 164, e.g., a copper foil or resin coated copper sheet. Conductive layer 166 includes one or more layers of Al, Cu, Sn, Ni, Au, Ag, or other suitable electrically conductive material.

In FIG. 3b, conductive layer 166 is patterned into a plurality of contact pads and conductive traces distributed across carrier 160. Conductive layer 166 is patterned using a photoresist or printed mask followed by wet etching, dry etching, deep reactive-ion etching, or another metal etching process. Conductive layer 166 forms a back-side redistribution layer (RDL) for a double-sided package.

In some embodiments, conductive layer 166 is formed as a patterned layer using a semi-additive process. In one embodiment, copper foil is thinned prior to forming a photoresist layer, and a selective, semi-additive plating process is used to form patterned conductive layer 166. In other embodiments, a seed layer is used that includes Ti/Cu, titanium tungsten (TiW)/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating. A semi-additive process is completed, the photoresist is removed, and the portions of the seed layer which remain exposed are removed by etching to leave conductive layer 166 as an RDL pattern.

Saw street 170 is located between locations where singulated semiconductor die 124 will be disposed to form separate sub-packages. In one embodiment, conductive layer 166 is completely removed within the area of saw street 170.

An insulating or passivation layer 174 is formed over insulating layer 164 and conductive layer 166 using PVD, CVD, printing, lamination, spin coating, spray coating, sintering or thermal oxidation. Insulating layer 174 contains one or more layers of SiO2, Si3N4, SiON, Ta2O5, Al2O3, polymer dielectric resist with or without fillers or fibers, or other material having similar insulating and structural properties. In one embodiment, insulating layer 174 includes a glass cloth, filler, or fiber, such as E-glass cloth, T-glass cloth, Al2O3, or silica filler, for enhanced bending strength. A portion of insulating layer 174 is removed by LDA to expose conductive layer 166. Alternatively, a portion of insulating layer 174 is removed by an etching process through a patterned photoresist layer to expose conductive layer 166.

Collectively, insulating layers 164 and 174 and conductive layer 166 constitute a build-up interconnect structure 180 formed over carrier 160. Build-up interconnect structure 180 may include as few as one RDL or conductive layer, such as conductive layer 166, and one insulating layer, such as insulating layer 174. Additional insulating layers and RDL layers can be formed over insulating layer 174 to provide additional vertical and horizontal electrical connectivity across the package according to the design and functionality of later mounted semiconductor die and devices. Additional insulating and metal layers may be formed within build-up interconnect structure 180 to provide grounding and EMI shielding layers within the semiconductor package. Additional metal layers of build-up interconnect structure 180 may form passive components, e.g., inductors, metal-insulator-metal (MIM) capacitors, and resistors. In one embodiment, build-up interconnect structure 180 includes fine-pitched conductive traces with less than a 200 µm pitch.

A patterning or photoresist layer 190 is formed over build-up interconnect structure 180 in FIG. 3d. A portion of photoresist layer 190 is removed by a photolithography and etching process, or LDA, to form openings 192. Openings 192 are formed over the removed portions of insulating layer 174 and extending to contact pads of conductive layer 166. In some embodiments, a conductive seed layer of Cu, Ti/Cu, TiW/Cu, Ni, NiV, Au, Al, or other suitable seed material is formed using a patterning and metal deposition process such as PVD, CVD, sputtering, electrolytic plating, and electroless plating prior to deposition of photoresist layer 190.

In FIG. 3e, an electrically conductive material is deposited into openings 192 of photoresist layer 190 using Cu plating, electrolytic plating, electroless plating, or other suitable metal deposition process to form conductive pillars or vertical interconnect structures 194. In one embodiment, conductive material for pillars 194 is deposited to a height greater than a thickness of photoresist layer 190, and a backgrinding, etching, or other planarization process is performed so that a top surface of pillars 194 and photoresist layer 190 are coplanar as illustrated in FIG. 3e. In another embodiment, conductive pillars 194 are 3-D metal posts formed by copper plating or copper stud bumps.

In FIG. 3f, remaining portions of photoresist layer 190 are stripped away leaving conductive pillars or vertical interconnect structures 194. After stripping photoresist layer 190, portions of any used seed layer outside conductive pillars 194 are etched away and a leakage descum is performed. Conductive pillars 194 can have a cylindrical shape with a circular or oval cross-section, or conductive pillars 194 can have a cubic shape with a rectangular cross-section. Other pillar 194 cross-section shapes are used in other embodiments.

In some embodiments, build-up interconnect structure 180 and conductive pillars 194 are inspected and tested to be known good at the wafer level by open/short probe or auto-scope inspection at the present interim stage, i.e., prior to mounting a semiconductor die. Leakage can be tested at a sampling location. Screening for defective interconnections prior to mounting semiconductor die over build-up interconnect structure 180 minimizes the number of KGD wasted over defective interconnect structures.

In FIG. 3g, semiconductor die 124, as singulated from semiconductor wafer 120 in FIG. 2d, are disposed over build-up interconnect structure 180 between conductive pillars 194. Semiconductor die 124 are KGD having been tested prior to mounting the semiconductor die to insulating layer 174. In some embodiments, die-attach adhesive 198 is deposited over back surface 128 of semiconductor die 124 prior to disposing the semiconductor die onto build-up interconnect structure 180. In other embodiments, die-attach adhesive 198 is deposited onto insulating layer 174 prior to disposing semiconductor die 124 onto insulating layer 174. Adhesive 198 can include epoxy resin, thermoplastic resin, acrylate monomer, a hardening accelerator, organic filler, silica filler, or polymer filler. Die-attach adhesive 198 is an adhesive film or paste. Die-attach adhesive 198 facilitates and strengthens the attachment of semiconductor die 124 to build-up interconnect structure 180.

Semiconductor die 124 has conductive pillars 200 formed over contact pads 132 prior to singulation from semiconductor wafer 120 using a photoresist layer similar to how conductive pillars 194 are formed. Conductive pillars 200 extend to approximately the same height over build-up interconnect structure 180 as conductive pillars 194. In some embodiments, bond wires 202 are provided to couple select contact pads 132 to conductive layer 166. Bond wires 202 are wedge bonded or stud bumped conductive wires. Bond wires are formed of copper or other metal alloy wire as a three-dimensional interconnection. In other embodiments, only conductive pillars 200 and 194 are used, and contact pads 132 are coupled to conductive layer 166 through the conductive pillars and subsequently formed front-side RDL.

In some embodiments, one or more discrete components 204 are disposed on build-up interconnect structure 180 and electrically connected to conductive layer 166 using solder, solder paste, bond wires, or other appropriate interconnect structure. In one embodiment, bond wires 202 are provided to couple contact pads 132 of semiconductor die 124 to contact pads of discrete component 204. Discrete components 204 include capacitors, inductors, resistors, diodes, transistors, and other discrete components in various embodiments.

In FIG. 3h, an encapsulant or molding compound 208 is deposited over build-up interconnect structure 180, semiconductor die 124, pillars 194 and 200, discrete components 204, and bond wires 202 as an insulating material using a paste printing, compressive molding, transfer molding, liquid encapsulant molding, vacuum lamination, spin coating, or other suitable applicator. In one embodiment, encapsulant 208 is deposited using tape assisted transfer molding. Encapsulant 208 is deposited over and around semiconductor die 124, discrete components 204, and conductive pillars 194 and 200 to form a reconstituted wafer 210. Encapsulant 208 can be polymer composite material, such as epoxy resin with filler, epoxy acrylate with filler, or polymer with proper filler. Encapsulant 208 is non-conductive and environmentally protects the semiconductor device from external elements and contaminants. Encapsulant 208 also protects semiconductor die 124 from degradation due to exposure to light.

In one embodiment, encapsulant 208 is deposited to a height over build-up interconnect structure 180 that is greater than a height of conductive pillars 194, conductive pillars 200, and bond wires 202. A backgrinding, mechanical planarization, chemical-mechanical planarization, or other etching or planarization process is used to remove portions of encapsulant 208 and create a surface 212 comprised of the top surface of encapsulant 208 coplanar with top surfaces of pillars 194 and 200. Bond wires 202 remain completely covered by encapsulant 208. In some embodiments, conductive pillars 194 and 200 are formed as conductive vias through encapsulant 208 after the encapsulant is deposited, rather than as standalone conductive pillars formed using a separate photoresist layer.

FIG. 3i shows reconstituted wafer 210 singulated through encapsulant 208, build-up interconnect structure 180, and carrier 160 using a saw blade or laser cutting tool 216 to create individual sub-packages 220. Sub-packages 220 include one or more semiconductor die 124 and, optionally, one or more discrete components 204 on build-up interconnect structure 180 and carrier 160. Pillars 194 and 200, bond wires 202, or both, are provided for 3-D interconnection. Build-up interconnect structure 180 is provided as a backside RDL for the final package. Forming build-up interconnect structure 180 and other 3-D interconnect structures on carrier 160 allows formation of fine-pitched RDL and 3-D interconnection with low warpage.

FIG. 4 illustrates a sub-package 240. Sub-package 240 is similar to sub-package 220. Sub-package 240 is formed without bond wires 202 or conductive pillars 200, instead relying on conductive pillars 194 for 3-D interconnection. Encapsulant 208 is planarized down to insulating layer 134 using a backgrinding or etching process so that subsequently formed RDL layers are able to directly connect to contact pads 132 without pillars 200. In some embodiments, portions of insulating layer 134 over contact pads 132 are removed by etching, LDA, or other appropriate processes to expose the contact pads for subsequent interconnection after completion of sub-package 240. A top surface of insulating layer 134 is co-planar with top surfaces of conductive pillars 194 and encapsulant 208. In other embodiments, encapsulant 208 is planarized to active surface 130 of semiconductor die 124, which completely removes insulating layer 134. Active surface 130 is co-planar with encapsulant 208 and conductive pillars 194. An additional conductive via or pillar 242 is formed as a top-side contact to discrete component 204 either before or after backgrinding of encapsulant 208. In one embodiment, LDA is used to expose contact pads of discrete component 204 having a tin or copper finish.

FIG. 5 illustrates sub-package 260. Sub-package 260 is similar to sub-package 240 but includes build-up interconnect structure 262 instead of build-up interconnect structure 180. Build-up interconnect structure 262 includes conductive layer 266, insulating layer 268, conductive layer 270, and insulating layer 274 in addition to conductive layer 166 and insulating layer 174. Conductive layer 266 is formed directly on carrier 160 and interface layer 262. Carrier 160 is removed in subsequent processing steps to expose conductive layer 266 as contact pads.

Insulating layer 268 is formed over conductive layer 266. Portions of insulating layer 268 over conductive layer 266 are removed to expose conductive layer 266. Conductive layer 270 is formed on insulating layer 268 and extending into the openings through insulating layer 268 to contact conductive layer 266. Insulating layer 274 is formed over conductive layer 270. Openings are formed in insulating layer 274 to expose conductive layer 270. Conductive layer 166 is formed over insulating layer 274 and extending to conductive layer 270 through the openings of insulating layer 274. Insulating layer 174 is formed over conductive layer 166. Utilizing more conductive layers stacked in build-up interconnect structure 262 allows more complex 3-D interconnection. More or less than three conductive layers are used on other embodiments.

Each of the conductive layers 266, 270, and 166 of build-up interconnect structure 262 are formed using sputtering, electrolytic plating, electroless plating, or other suitable deposition process. Conductive layers 266, 270, and 166 can each be one or more layers of Al, Cu, Sn, Ni, Au, Ag, titanium (Ti), tungsten (W), or other suitable electrically conductive material. Conductive layers 266, 270, and 166 include lateral RDL and vertical conductive vias to provide vertical and horizontal conduction paths through build-up interconnect structure 262. Portions of conductive layers 266, 270, and 166 are electrically common or electrically isolated according to the design and function of semiconductor die 124 and additional semiconductor die subsequently coupled to sub-package 260. Insulating layers 268, 274, and 174 include one or more layers of SiO2, Si3N4, SiON, Ta2O5, Al2O3, or other material having similar structural properties. Portions of insulating layers 268, 274, and 174 are removed to expose underlying conductive layers using etching or LDA.

FIG. 6 illustrates sub-package 280, which is similar to sub-package 240 but with build-up interconnect structure 282. In build-up interconnect structure 282, a portion of insulating layer 164 is removed prior to formation of conductive layer 166. Conductive layer 166 extends through openings in insulating layer 164 to form recessed contact pads in contact with interface layer 162 or carrier 160. After removal of carrier 160 in subsequent process steps, the recessed portions of conductive layer 166 are exposed through insulating layer 164 as contact pads without requiring additional LDA or etching of insulating layer 164.

FIG. 7 illustrates sub-package 300 with IPDs formed by layers of build-up interconnect structure 302. Conductive layer 166 is formed on insulating layer 164 and patterned as necessary to interconnect the subsequently formed conductive layers. A dielectric or insulating layer 304 is formed over portion 166a of conductive layer 166. A conductive layer 306 is formed over insulating layer 304. Together, portion 166a of conductive layer 166, insulating layer 304, and conductive layer 306 form a MIM capacitor. Conductive layers 166 and 306 form the plates of a capacitor and insulating layer 304 is a capacitor dielectric between the plates.

A resistive layer 308 is also formed on insulating layer 164. Resistive layer 308 is similar to conductive layer 166, but formed with properties designed to control electrical resistance for current through resistive layer 308. In some embodiments, electrical resistance is increased by reducing a cross-section or increasing a length of resistive layer 308. In other embodiments, electrical resistance is increased by modifying the constituent materials of resistive layer 308. Resistive layer 308 forms a resistor as part of build-up interconnect structure 302.

Insulating layer 310 is formed over conductive layer 166, insulating layer 304, conductive layer 306, and resistive layer 308. Portions of insulating layer 310 are removed using etching or LDA to expose underlying conductive layers for electrical contact. A conductive layer 316 is formed over insulating layer 310 as electrical contacts for underlying IPD and RDL structures, as well as to form additional IPDs and RDL. Portions 316a of conductive layer 316 operate as contacts for MIM capacitor plates 166a and 306. Conductive layer 306 is coupled up to surface 212 of sub-package 300 by a conductive pillar 194. Plate 166a is coupled elsewhere by conductive traces of conductive layer 166, not illustrated. Portions 316b of conductive layer 316 form electrical contacts to resistive layer 308 similarly. Portions 316c of conductive layer 316 are coiled to exhibit inductive properties, forming an inductor as part of build-up interconnect structure 302. Select portions 316c of conductive layer 316 extend through insulating layer 310 for external electrical connection.

Insulating layer 320 is conformally applied over conductive layer 316 and insulating layer 310 to complete build-up interconnect structure 302. Conductive pillars 194 are formed, and semiconductor die 124 is disposed over build-up interconnect structure 302, as discussed above to complete sub-package 300.

Figure 8G:
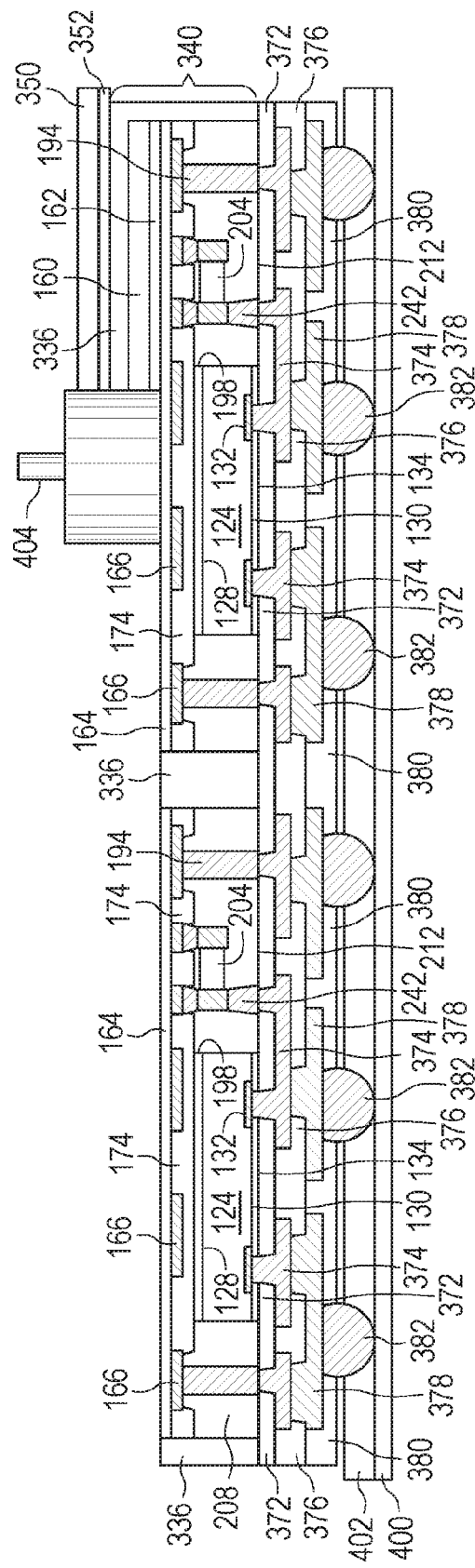

FIGS. 8a-8i illustrate a process of using any of the above described sub-packages to create a double-sided semiconductor package. In FIG. 8a, a plurality of sub-packages 240 is disposed over carrier 330 and optional interface layer 332. Carrier 330 and interface layer 332 are similar to carrier 160 and interface layer 162. While sub-packages 240 from FIG. 4 are illustrated, any of the above-described sub-packages are used in other embodiments. In some embodiments, sub-packages are created by mixing and matching features of the above-described sub-packages, e.g., using bond wires 202 with build-up interconnect structure 262, or using the IPDs of build-up interconnect structure 302 with the recessed pads of build-up interconnect structure 282.

Sub-packages 240 are placed on carrier 330 face-down. Active surface 130 of semiconductor die 124 is oriented toward carrier 330. Conductive pillars 194 extend to carrier 330 or interface layer 332. Conductive pillars 200 similarly extend to carrier 330 or interface layer 332 in embodiments that use conductive pillars 200 over contact pads 132. Space between each sub-package 240 is reserved as saw-streets 334.

In FIG. 8b, encapsulant 336 is deposited over carrier 330 using a paste printing, compressive molding, transfer molding, liquid encapsulant molding, vacuum lamination, spin coating, or other suitable applicator. Encapsulant 336 can be polymer composite material, such as epoxy resin with filler, epoxy acrylate with filler, or polymer with proper filler. Encapsulant 336 and sub-packages 240 form a reconstituted wafer or panel 340. Encapsulant 336 is present at the back-side of each sub-package 240 over carrier 160 and also between each sub-package 240. Each sub-package 240 is embedded in encapsulant 336. Build-up interconnect structure 180 is embedded in encapsulant 336. Encapsulant 336 completely covers side surfaces of sub-packages 240 and build-up interconnect structures 180. Using a second encapsulant 336 in addition to encapsulant 208 increases the warpage tuning capability during subsequent formation of front-side RDL.

In FIG. 8c, reconstituted wafer 340 is flipped and disposed on carrier 350, including optional interface layer 352. Carrier 330 and interface layer 332 are removed by chemical etching, mechanical peeling, CMP, mechanical grinding, thermal bake, UV light, laser scanning, or wet stripping to expose encapsulant 208, encapsulant 336, conductive pillars 194, conductive via 242, insulating layer 134, and contact pads 132. Conductive pillars 200 are exposed, rather than contact pads 132 and insulating layer 134, in embodiments that use conductive pillars 200. In some embodiments, portions of encapsulant 208, encapsulant 336, or insulating layer 134 over contact pads 132 are removed by etching or LDA to expose contact pads 132.

In FIG. 8d, an insulating or passivation layer 372 is formed over encapsulant 336, encapsulant 208, conductive pillars 194, conductive via 242, insulating layer 134, and contact pads 132 using PVD, CVD, printing, spin coating, spray coating, screen printing or lamination. Insulating layer 372 can be one or more layers of SiO2, Si3N4, SiON, Ta2O5, Al2O3, or other material having similar insulating and structural properties. In one embodiment, insulating layer 372 is a photosensitive dielectric polymer low-cured at less than 200° C. A portion of insulating layer 372 is removed by an etching process with a patterned photoresist layer or by LDA to form openings over and exposing contact pads 132, conductive pillars 194, and conductive via 242. In some embodiments, a portion of insulating layer 372 in saw street 334 is removed.

An electrically conductive layer or RDL 374 is formed over insulating layer 372, contact pads 132, conductive pillars 194, and conductive via 242 using a patterning and metal deposition process such as printing, PVD, CVD, sputtering, electrolytic plating, and electroless plating. Conductive layer 374 can be one or more layers of Al, Cu, Sn, Ti, Ni, Au, Ag, W, or other suitable electrically conductive material. A portion of conductive layer 374 extends horizontally along insulating layer 372 and parallel to active surface 130 of semiconductor die 124 to laterally redistribute the electrical signals between contact pads 132, conductive pillars 194, and conductive via 242. Conductive layer 374 extends vertically into openings of insulating layer 372 to contact pads 132, conductive pillars 194, and conductive via 242. In one embodiment, conductive layer 374 is etched or patterned to completely remove conductive layer 374 within saw street 334.

In FIG. 8e, an insulating or passivation layer 376 is formed over insulating layer 372 and conductive layer 374 using PVD, CVD, printing, spin coating, spray coating, screen printing or lamination. Insulating layer 376 can be one or more layers of SiO2, Si3N4, SiON, Ta2O5, Al2O3, or other material having similar insulating and structural properties. In one embodiment, insulating layer 376 is a photosensitive dielectric polymer low-cured at less than 200° C. A portion of insulating layer 376 is removed by an etching process with a patterned photoresist layer or by LDA to form openings exposing conductive layer 374. In one embodiment, insulating layer 376 is completely removed in saw street 334.

An electrically conductive layer or RDL 378 is formed over insulating layer 376 and conductive layer 374 using a patterning and metal deposition process such as printing, PVD, CVD, sputtering, electrolytic plating, and electroless plating. Conductive layer 378 can be one or more layers of Al, Cu, Sn, Ti, Ni, Au, Ag, W, or other suitable electrically conductive material. A portion of conductive layer 378 extends horizontally along insulating layer 376 and parallel to active surface 130 of semiconductor die 124 to laterally redistribute the electrical interconnect to conductive layer 374. Conductive layer 378 extends vertically through openings in insulating layer 376 to contact conductive layer 374. Portions of conductive layer 378 are electrically common or electrically isolated depending on the design and function of the semiconductor device. In some embodiments, conductive layer 378 is completely removed within saw street 334.

In FIG. 8f, an insulating or passivation layer 380 is formed over insulating layer 376 and conductive layer 378 using PVD, CVD, printing, spin coating, spray coating, screen printing or lamination. Insulating layer 380 can be one or more layers of SiO2, Si3N4, SiON, Ta2O5, Al2O3, or other material having similar insulating and structural properties. In one embodiment, insulating layer 380 is a photosensitive dielectric polymer low-cured at less than 200° C. A portion of insulating layer 380 is removed by an etching process with a patterned photoresist layer or by LDA to form openings exposing conductive layer 378. In one embodiment, insulating layer 380 is completely removed within saw street 334.

An electrically conductive bump material is deposited over conductive layer 378 in openings of insulating layer 380 using an evaporation, electrolytic plating, electroless plating, ball drop, or screen printing process. In one embodiment, the bump material is deposited with a ball drop stencil, without requiring a mask. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 378 using a suitable attachment or bonding process. In one embodiment, the bump material is reflowed by heating the material above the material's melting point to form balls or bumps 382. In some applications, bumps 382 are reflowed a second time to improve electrical contact to conductive layer 378. Bumps 382 can also be compression bonded or thermocompression bonded to conductive layer 378. In one embodiment, bumps 382 are formed over a UBM having a wetting layer, barrier layer, and adhesion layer. Bumps 382 represent one type of interconnect structure that can be formed over conductive layer 378. The interconnect structure can also use bond wires, conductive paste, stud bump, micro bump, or other electrical interconnect.

Collectively, insulating layers 372, 376, and 380, conductive layers 374 and 378, and bumps 382 form a front-side build-up interconnect structure 390 formed over reconstituted wafer 340. Build-up interconnect structure 390 may include as few as one RDL or conductive layer, e.g., conductive layer 374, and one insulating layer, such as insulating layer 372. Additional insulating layers and RDLs can be formed over insulating layer 380 prior to forming bumps 382, to provide additional vertical and horizontal electrical connectivity across the reconstituted wafer 340 according to the design and functionality of the semiconductor device. Additional insulating and metal layers may also be formed within build-up interconnect structure 390 to provide grounding and EMI shielding layers within the semiconductor package. Build-up interconnect structure 390 is inspected and tested to be known good at an interim stage, i.e., prior to additional device integration.

In FIG. 8g, a support carrier 400 and backgrinding tape 402 is applied over build-up interconnect structure 390 and in contact with bumps 382. In some embodiments, backgrinding tape 402 is in contact with insulating layer 380. Carrier 350, a portion of encapsulant 336, and carrier 160 are removed in a grinding operation using mechanical grinder 404. In some embodiments, carrier 350 is removed by chemical etching, mechanical peeling, CMP, mechanical grinding, thermal bake, UV light, laser scanning, or wet stripping prior to removal of encapsulant 336 and carrier 160 by grinder 404. The grinding operation exposes insulating layer 164 of sub-packages 240. After grinding, remaining portions of encapsulant 336 around sub-packages 240 are coplanar with the surface of insulating layer 164 opposite semiconductor die 124.

Figure 8H:
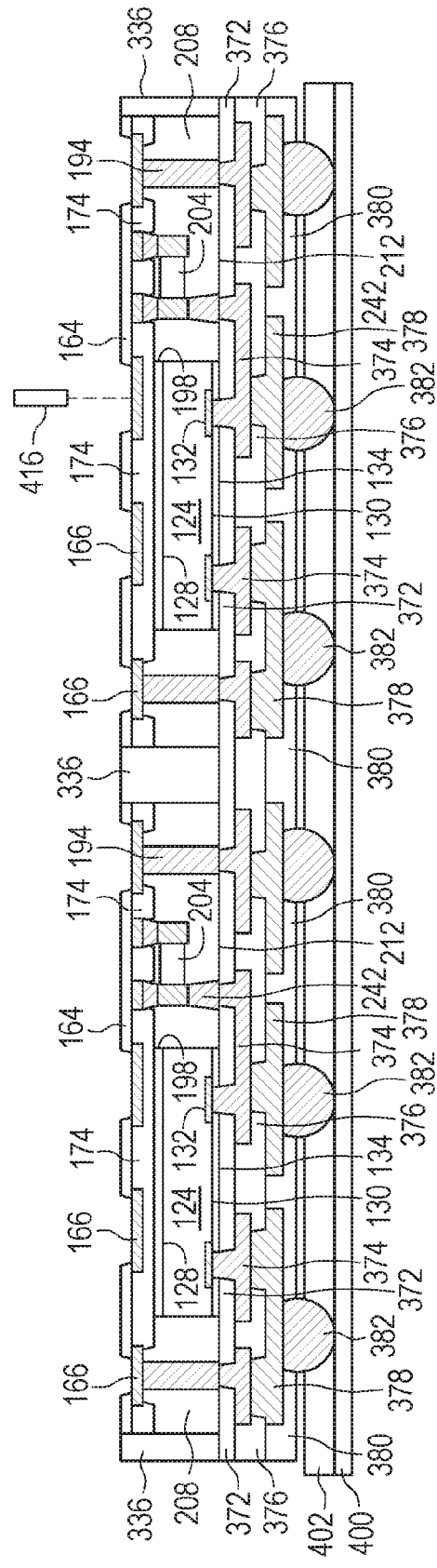

In FIG. 8h, a portion of insulating layer 164 is removed to form openings over and exposing conductive layer 166. Openings are formed by LDA using laser 416, etching, or other suitable process. Openings through insulating layer 164 are configured to provide electrical interconnect to semiconductor die or devices, for example, semiconductor die, memory devices, passive devices, saw filters, inductors, antenna, etc., stacked over semiconductor die 124. In one embodiment, a finish such as Cu organic solderability preservative (OSP) is applied to the exposed portions of conductive layer 166 to prevent Cu oxidation.

In FIG. 8i, reconstituted wafer 340 is singulated through build-up interconnect structure 390 and encapsulant 336 using a saw blade or laser cutting tool 422 into individual double-sided packages 430.

FIG. 9a illustrates a singulated double-sided package 430 removed from carrier 400. Semiconductor die 124 is electrically connected to conductive bumps 382 by RDL of front-side build-up interconnect structure 390. Semiconductor die 124 is electrically connected to contact pads of conductive layer 166 by front-side build-up interconnect structure 390, conductive pillars 194, and back-side build-up interconnect structure 180. Double-sided package 430 includes one or more additional semiconductor packages mounted over back-side build-up interconnect structure 180 and electrically connected to semiconductor die 124 through back-side build-up interconnect structure 180, pillars 194, and front-side build-up interconnect structure 390. Double-sided package 430 is disposed over a PCB or other substrate, e.g., PCB 52. Conductive bumps 382 are heated above a reflow temperature to electrically and mechanically connect package 430 to contact pads on PCB 52.

Double-sided package 430 is formed using a dual-mold approach. A first mold is used to deposit encapsulant 208 around semiconductor die 124 and over back-side build-up interconnect structure 180. A second mold is used to embed back-side build-up interconnect structure 180 and encapsulant 208 in encapsulant 336. Encapsulant 336 is deposited after formation of back-side build-up interconnect structure 180 and surrounds back-side build-up interconnect structure 180 during formation of front-side build-up interconnect structure 390 to give a manufacturer of double-sided package 430 increased capability of adjusting for warpage during formation of front-side build-up interconnect structure 390.

Figure 9B:
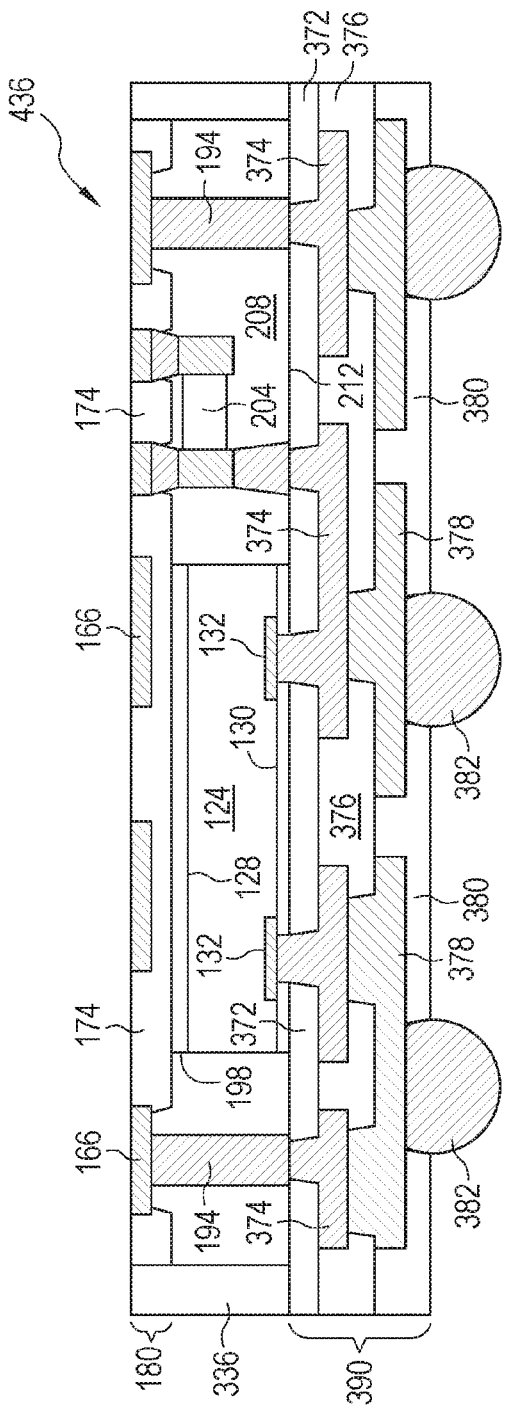

FIG. 9b illustrates double-sided package 436. double-sided package 436 is similar to double-sided package 430 but insulating layer 164 is completely removed by grinder 404 in FIG. 8g. No separate LDA or etching step is used to expose conductive layer 166. Conductive layer 166 is exposed for subsequent interconnection by the backgrinding step in FIG. 8g.

Figure 9C:
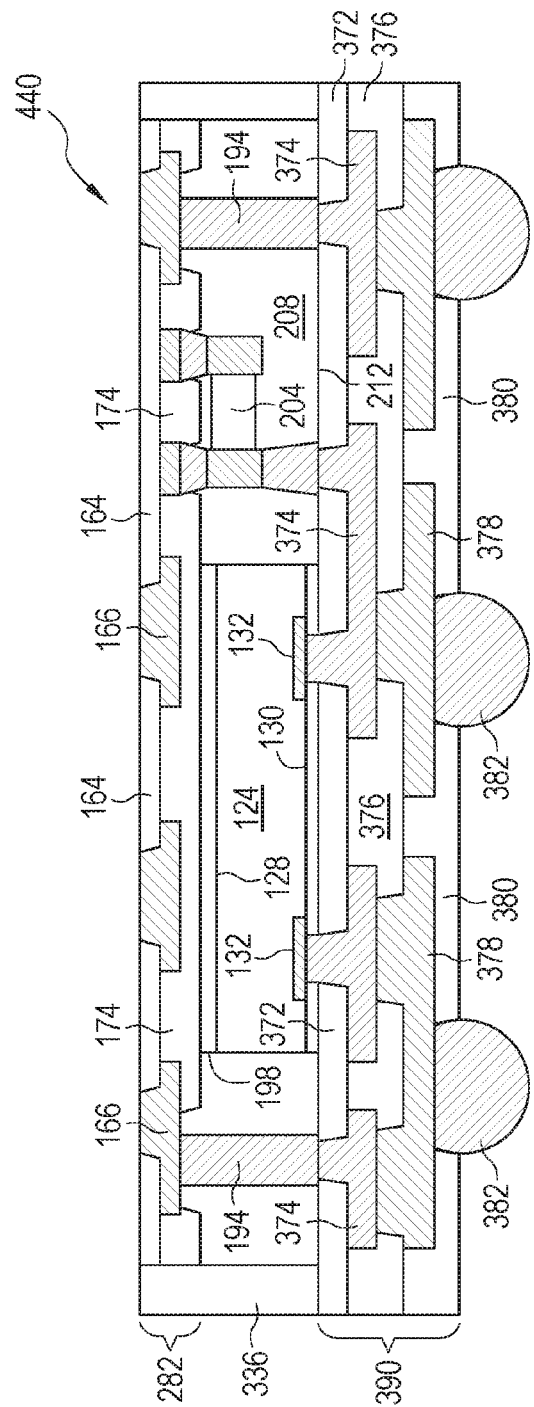

FIG. 9c illustrates double-sided package 440. Double-sided package 440 is formed with back-side build-up interconnect structure 282, having recessed contact pads formed as part of conductive layer 166, rather than back-side build-up interconnect structure 180. Back-side build-up interconnect structure 282 includes openings formed through insulating layer 164 prior to deposition and patterning of conductive layer 166. The grinding step in FIG. 8g exposes the portions of conductive layer 166 that are recessed into the openings in insulating layer 164. Even though insulating layer 164 is not fully removed, contact pad portions of conductive layer 166 are exposed by removal of encapsulant 336 and carrier 160 with grinder 404.

Figure 10:
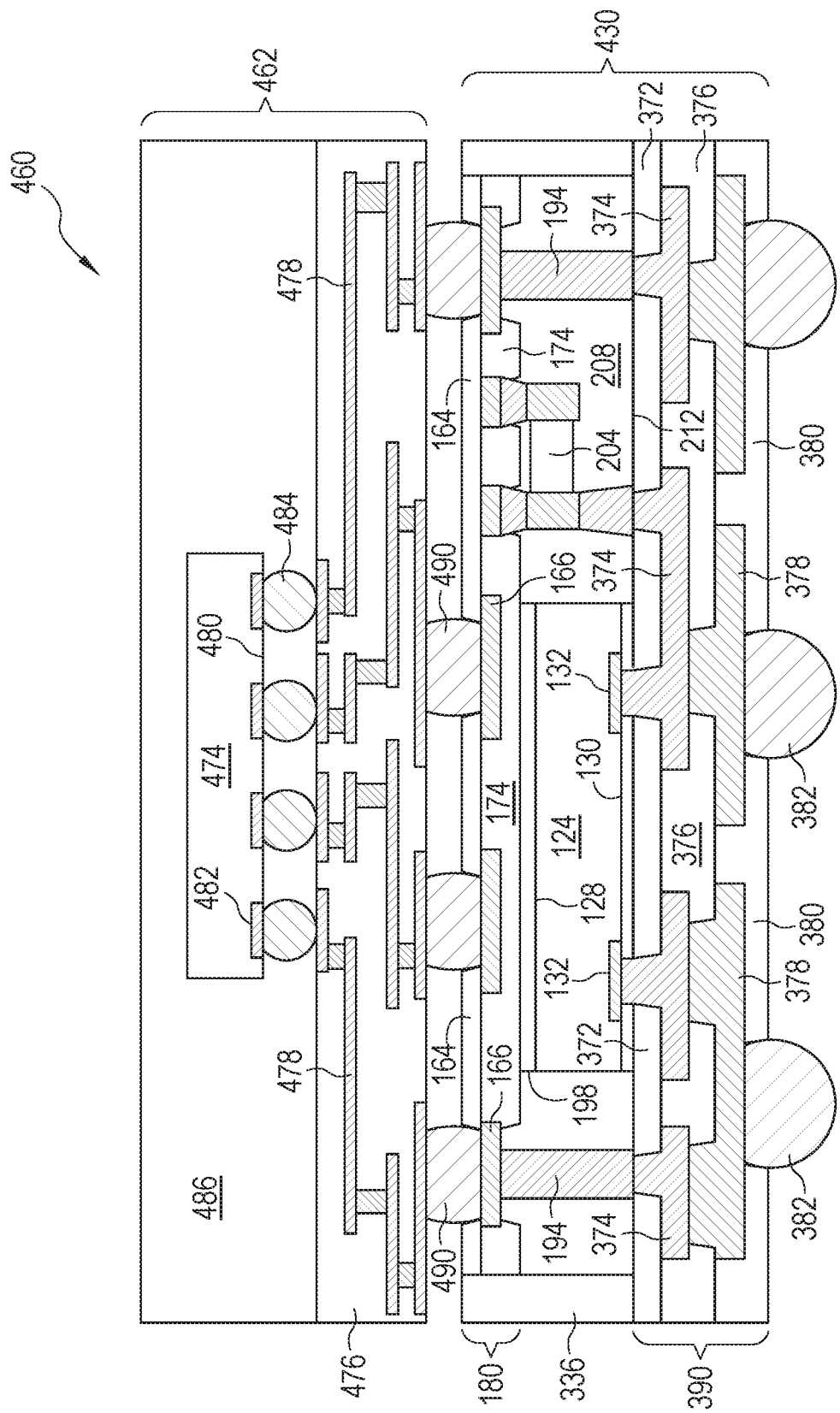
FIG. 10 illustrates the double-sided package as the bottom package of a package-on-package device.

FIG. 10 illustrates double-sided package 430 used as the bottom package of a package-on-package device 460. A top package 462 is disposed over double-sided package 430. Top package 462 includes a semiconductor die 474 disposed over an interposer or build-up interconnect structure 476. In some embodiments, interconnect structure 476 is a prefabricated interposer or PCB with semiconductor die 474 mounted to the interposer. In other embodiments, interconnect structure 476 is a build-up interconnect structure formed over semiconductor die 474 similar to build-up interconnect structure 390. Interconnect structure 476 includes conductive layers 478 to fan-out electrical connections from semiconductor die 474 to locations aligning with contact pads of conductive layer 166. Semiconductor die 474 includes contact pads 482 coupled to conductive layers 478 of interconnect structure 476 by conductive bumps 484. An encapsulant 486 is disposed over semiconductor die 474 and interconnect structure 476 for environmental protection. Conductive bumps 490 formed over interconnect structure 476 are reflowed to electrically and mechanically couple top package 462 to double-sided package 430 in a package-on-package formation.

Semiconductor die 474 is electrically coupled to semiconductor die 124 through bumps 484, interconnect structure 476, bumps 490, back-side build-up interconnect structure 180, conductive pillars 194, and front-side build-up interconnect structure 390. Conductive bumps 382 further connect both semiconductor die 474 and 124 to a PCB or substrate that package-on-package device 460 is mounted onto. Package-on-package device 460 provides the functionality of both semiconductor die 124 and semiconductor die 474 to a larger system or electronic device 50 formed on PCB 52.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first conductive layer;
   a semiconductor die disposed over the first conductive layer;
   a conductive pillar formed over the first conductive layer;
   a first encapsulant deposited over the first conductive layer and semiconductor die;
   a second encapsulant deposited around the first encapsulant, first conductive layer, and semiconductor die; and
   a second conductive layer formed over the semiconductor die, first encapsulant, and second encapsulant opposite the first conductive layer, wherein the conductive pillar extends through the first encapsulant between the first conductive layer and second conductive layer.

2. The semiconductor device of claim 1, wherein the first conductive layer is formed over a carrier.

3. The semiconductor device of claim 1, wherein the first conductive layer is formed over an insulating layer.

4. The semiconductor device of claim 3, wherein the insulating layer includes an opening and the first conductive layer extends into the opening.

5. The semiconductor device of claim 1, further including a discrete electrical component disposed over the first conductive layer adjacent to the semiconductor die.

6. The semiconductor device of claim 1, further including a semiconductor package mounted to the first conductive layer.

7. A semiconductor device, comprising:
   a substrate including an electrically conductive layer formed over the substrate;
   a semiconductor die disposed over the electrically conductive layer;
   a first encapsulant deposited around the semiconductor die;
   a second encapsulant deposited around the first encapsulant, substrate, and semiconductor die; and
   a build-up interconnect structure formed over the semiconductor die, the first encapsulant, and the second encapsulant, wherein the semiconductor die and first encapsulant are disposed between the substrate and build-up interconnect structure, and the second encapsulant extends over the substrate opposite the semiconductor die.

8. The semiconductor device of claim 7, wherein the second encapsulant is deposited over the substrate opposite the semiconductor die.

9. The semiconductor device of claim 7, further including an insulating layer comprising glass fibers or cloth formed on the substrate, wherein the semiconductor die is disposed over the insulating layer.

10. The semiconductor device of claim 7, wherein the second encapsulant is deposited around the electrically conductive layer.

11. The semiconductor device of claim 7, further including an interconnect structure formed over the semiconductor die, first encapsulant, and second encapsulant opposite the electrically conductive layer.

12. The semiconductor device of claim 7, further including a conductive pillar formed over the semiconductor die and within the first encapsulant.

13. The semiconductor device of claim 7, further including a bond wire coupled between the semiconductor die and the electrically conductive layer.

14. A semiconductor device, comprising:
an interconnect structure;
a first semiconductor die disposed over the interconnect structure;
a first encapsulant deposited over the first semiconductor die and including a side surface of the first encapsulant that is coplanar with a side surface of the interconnect structure;
a second encapsulant deposited around the first semiconductor die, interconnect structure, and first encapsulant; and
a build-up interconnect structure formed over the first semiconductor die, first encapsulant, and second encapsulant, wherein the first encapsulant and second encapsulant are in direct physical contact with the build-up interconnect structure.

15. The semiconductor device of claim 14, wherein the second encapsulant covers the side surface of the first encapsulant and the side surface of the interconnect structure.

16. The semiconductor device of claim 14, wherein the interconnect structure includes:
an insulating layer including an opening formed through the insulating layer; and
a conductive layer formed over the insulating layer and extending into the opening of the insulating layer.

17. The semiconductor device of claim 14, further including a conductive pillar formed over the interconnect structure in the first encapsulant.

18. The semiconductor device of claim 14, further including a second semiconductor die disposed over the first semiconductor die and electrically connected to the first semiconductor die through the interconnect structure.

19. The semiconductor device of claim 14, further including a discrete electrical component disposed over the interconnect structure adjacent to the semiconductor die.

20. The semiconductor device of claim 14, further including a carrier, wherein the interconnect structure is formed on the carrier and the second encapsulant covers the carrier.

21. A semiconductor device, comprising:
a first semiconductor die;
a first conductive layer formed over the first semiconductor die;
a first encapsulant deposited around the first semiconductor die and over first conductive layer;
a second encapsulant deposited around the first encapsulant, first semiconductor die, and first conductive layer;
a second conductive layer formed over the first encapsulant and second encapsulant opposite the first semiconductor die; and
a conductive pillar disposed through the first encapsulant and coupled between the first conductive layer and the second conductive layer.

22. The semiconductor device of claim 21, wherein the second encapsulant surrounds the first encapsulant, first conductive layer, and first semiconductor die.

23. The semiconductor device of claim 21, further including a second semiconductor die disposed over the first semiconductor die and coupled to the first semiconductor die through the first conductive layer.

* * * * *